(12) United States Patent
Ju et al.

(10) Patent No.: US 6,877,541 B2
(45) Date of Patent: Apr. 12, 2005

(54) TAPE FEEDER FOR CHIP MOUNTERS

(75) Inventors: Min Jin Ju, Gwangmyeong (KR); Sung Min Kang, Namdong-gu (KR); Soo Jin Lee, Gyeyang-gu (KR); Dae Hee Jo, Hanam (KR)

(73) Assignee: Protec Co., Ltd., Incheon (KR)

( * ) Notice: Subject to any disclaimer, the term of this patent is extended or adjusted under 35 U.S.C. 154(b) by 0 days.

(21) Appl. No.: 10/818,660

(22) Filed: Apr. 6, 2004

(65) Prior Publication Data

US 2004/0200578 A1 Oct. 14, 2004

(30) Foreign Application Priority Data

| Apr. 10, 2003 | (KR) | 10-2003-0022509 |
| Apr. 10, 2003 | (KR) | 10-2003-0022508 |
| Jan. 26, 2004 | (KR) | 10-2004-0004732 |

(51) Int. Cl.[7] ............................................. B32B 31/00
(52) U.S. Cl. .................. 156/541; 145/540; 145/579
(58) Field of Search ................................. 156/230, 234, 156/235, 238, 297, 538, 539, 540, 541, 556, 574, 577, 579

(56) References Cited

U.S. PATENT DOCUMENTS 4,494,902 A * 1/1985 Kuppens et al. ............... 221/74
5,871,610 A * 2/1999 Minohoshi et al. ........... 156/362
6,347,655 B1 * 2/2002 Yamamoto et al. ........... 156/540
6,357,503 B1 * 3/2002 Kromer et al. ............... 156/351

* cited by examiner

Primary Examiner—James Sells
(74) Attorney, Agent, or Firm—Jordan and Hamburg LLP

(57) ABSTRACT

Disclosed herein is a tape feeder for chip mounters. The tape feeder is constructed so that front and rear locators are restrained by a restraint slot of a cam slider moving horizontally, and bearings of the front and rear locators alternatively execute vertical and horizontal movements while sliding along the restraint slot by a reciprocating motion of a cam slider, thus repeatedly moving a carrier tape backward while locking the carrier tape and moving the carrier tape forward while releasing the carrier tape, therefore allowing the carrier tape to be fed precisely. The tape feeder allows the carrier tape to be fed precisely, and prevents chips from being turned over and removed from the carrier tape when a vinyl cover is discharged, thus minimizing a malfunction of the chip mounter during an operation of the chips and thereby maximizing operational reliability. Further, the tape feeder allows the number of elements to be reduced, in addition to achieving a slim construction. Thus, the number of tape feeders mounted to the chip mounter can be increased.

22 Claims, 22 Drawing Sheets

FIG. 24
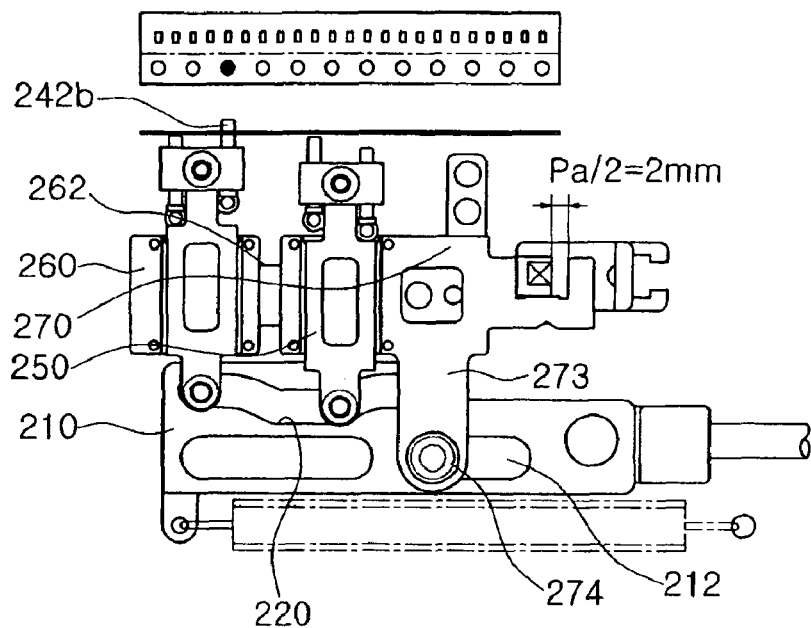
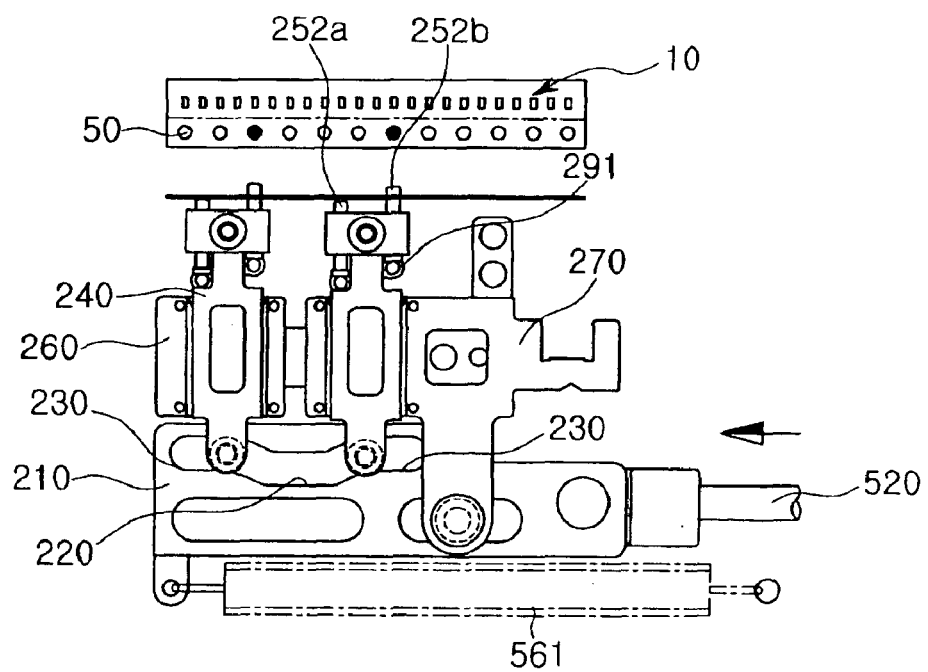
FIG. 25

FIG. 28
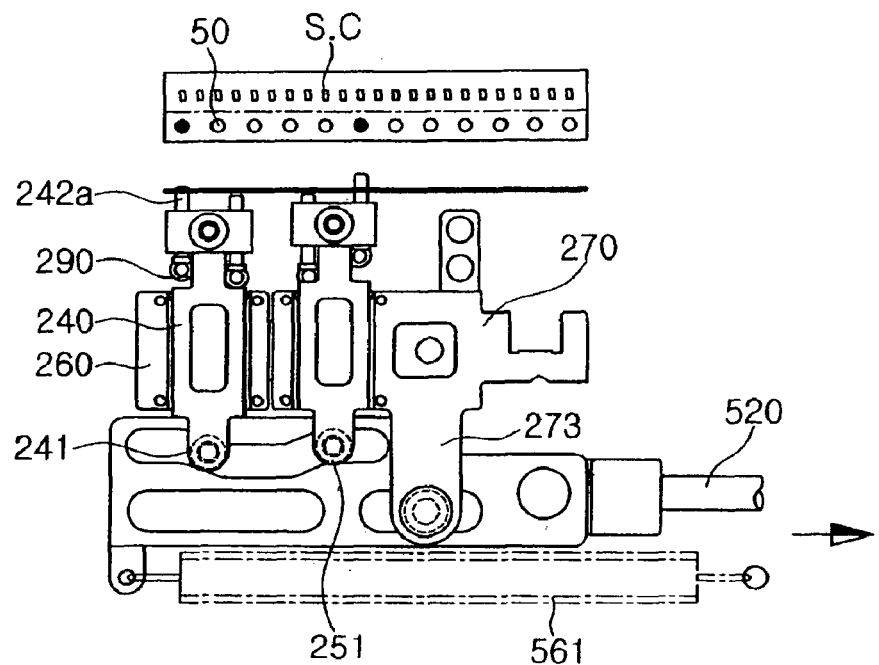
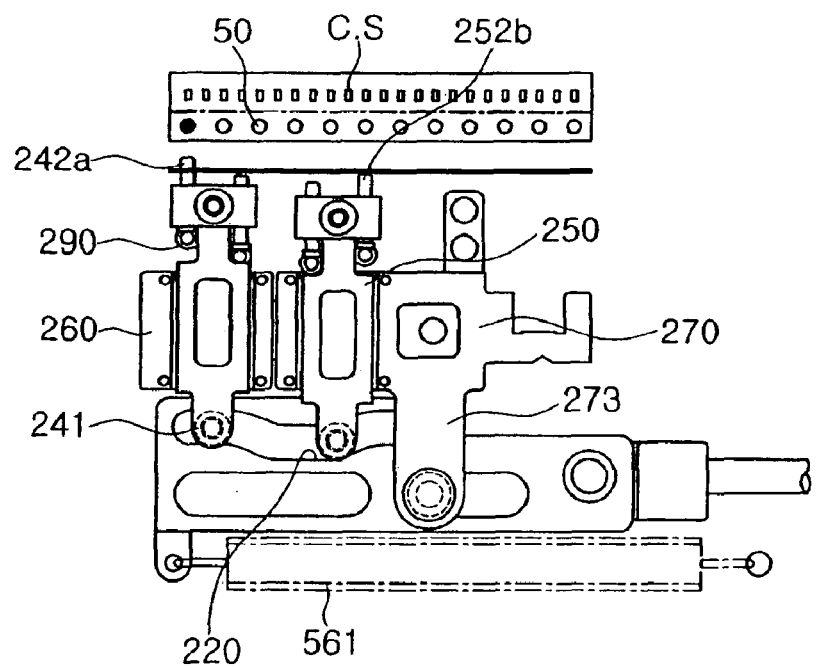
FIG. 29

TAPE FEEDER FOR CHIP MOUNTERS

BACKGROUND OF THE INVENTION

1. Field of the Invention

The present invention relates generally to tape feeders for chip mounters, and more particularly to a tape feeder for chip mounters which allows a carrier tape loaded with semiconductor chips to be fed by a rectilinear moving unit, thus allowing the carrier tape to be precisely fed, and preventing the chips from being turned over and removed from the carrier tape while a vinyl cover is discharged and thereby minimizing a malfunction when the chips are picked. Therefore operational reliability is maximized, in addition to reducing the number of elements and the volume of the tape feeder.

2. Description of the Related Art

Generally, an electronic part mounter, that is, a chip mounter is a device that picks up electronic parts (semiconductor chips) via a vacuum lifting method by a nozzle of a head which picks and places the electronic parts fed by a feeder, and then mounts the electronic parts on a board.

There have been disclosed various kinds of feeders, including a tape feeder, a chip feeder, a tray feeder, etc. The present invention relates to the tape feeder which is capable of feeding a large number of chips at a high rate.

A carrier tape is applied to the tape feeder. Because the semiconductor chips received in the carrier tape have a very small size, it is difficult to pick up the semiconductor chips one by one. Further, it is difficult to treat the semiconductor chips received in the carrier tape, because the semiconductor chips are likely to contamination by foreign materials, such as dust, and a probability of loss is high.

Thus, the carrier tape 10 which has been commonly used is constructed as shown in FIG. 1. That is, the semiconductor chips (S.C) are received in receiving spaces 30 which are provided on a paper tape 20 at regular pitches, and then are sealed by a vinyl cover 40 to cover the receiving spaces 30 having the semiconductor chips. A plurality of feeding holes 50 are bored in the paper tape 20 to be arranged at regular intervals along a side of the paper tape 20.

The carrier tape 10 moves by a predetermined pitch while the feeding holes 50 of the carrier tape 10 being locked by the tape feeder mounted to the chip mounter. While the carrier tape 10 moves, the vinyl cover 40 is separated from the paper tape 20, so that the receiving spaces 30 are exposed. Thereafter, the semiconductor chips of the exposed receiving spaces 30 are picked up by the nozzle of the chip mounter.

However, the conventional tape feeder is constructed so that the carrier tape is fed by a predetermined pitch, by rotating a sprocket wheel and a ratchet in a certain direction while the feeding holes of the carrier tape are locked by a gear of the sprocket wheel.

Since the tape feeder is fed along segments of a circle divided at regular intervals, rotating tolerances are cumulated when the carrier tape is fed to some extent by the rotation of the sprocket wheel. In this case, the semiconductor chips are not precisely fed to target positions and thereby the feeding operation must be set again, therefore deteriorating workability and causing the production of bad products due to a malfunction when the semiconductor chips are picked up.

Further, the volume of the feeder is increased due to a complicated construction, so that it is impossible to realize a slim construction, thus having a low workability.

SUMMARY OF THE INVENTION

Accordingly, the present invention has been made keeping in mind the above problems occurring in the prior art, and an object of the present invention is to provide a tape feeder for chip mounters which is operated so that a plurality of locators are restrained in a restraint slot and bearings of the locators alternatively move vertically and horizontally while sliding along the restraint slot by a reciprocating motion of a cam slider, thus repeatedly moving a carrier tape backward while locking the carrier tape and moving the carrier tape forward while releasing the carrier tape, therefore allowing the carrier tape to be fed precisely.

Another object of the present invention is to provide a tape feeder for chip mounters which allows a cover peeling operation to be precisely and safely executed and prevents chips from being turned over and removed from the carrier tape, thus preventing a malfunction of the chip mounter during a picking operation.

A further object of the present invention is to provide a tape feeder for chip mounters which simplifies a construction thereof, and allows a feeding operation to be very precisely executed and thereby accomplishing a precision feeding.

A still another object of the present invention is to provide a tape feeder for chip mounters which provides an air cushioning effect during an operation of an air cylinder, thus absorbing a shock when the carrier tape is fed, therefore enhancing an operational safety.

A still another object of the present invention is to provide a tape feeder for chip mounters which is constructed to be mounted to a feeder base by a toggle joint comprising a linkage with four links and which is easily mounted to the feeder base.

A still another object of the present invention is to provide a tape feeder for chip mounters which is constructed to prevent foreign materials, such as dust, from accessing a picking area of a gate unit, thus preventing the chips to be picked up from being contaminated.

In order to accomplish the above object, the present invention provides a tape feeder for chip mounters, which is operated so that front and rear locators are restrained in a cam section of a cam slider and bearings of the front and rear locators alternatively move vertically and horizontally while sliding along the cam section, thus repeatedly moving a carrier tape backward while locking the carrier tape and moving the carrier tape forward while releasing the carrier tape, therefore allowing the carrier tape to be fed precisely.

Further, a gate cover of the gate unit moves backward by a backward movement of the rear locator, so that the chips are exposed while being securely loaded in receiving spaces of a paper tape when the vinyl cover is discharged, thus achieving safety when the chips are picked up.

The tape feeder of this invention includes a tension spring, thus providing an air cushioning effect when the air cylinder moves forward.

BRIEF DESCRIPTION OF THE DRAWINGS

The above and other objects, features and other advantages of the present invention will be more clearly understood from the following detailed description taken in conjunction with the accompanying drawings, in which:

FIGS. 16 and 17 are views of a clamping unit included in the tape feeder of FIG. 3, in which FIG. 16 shows a state before the clamping unit is mounted to a feeder base of a chip mounter, and FIG. 17 shows a state after the clamping unit is mounted to the feeder base of the chip mounter; and FIGS. 18 through 29 show operations of feeding a carrier tape, according to the present invention.

DESCRIPTION OF THE PREFERRED EMBODIMENTS

Figure 1:
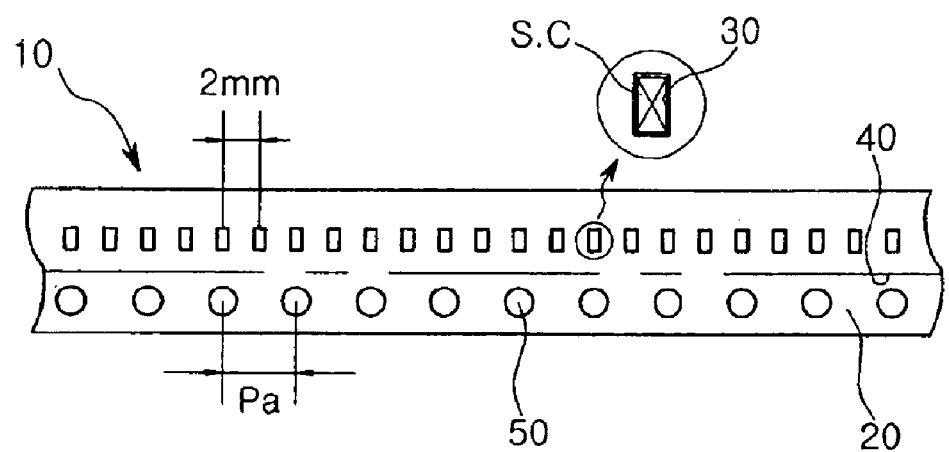
FIG. 1 is a plan view of a conventional carrier tape for chip mounters.
Figure 2:
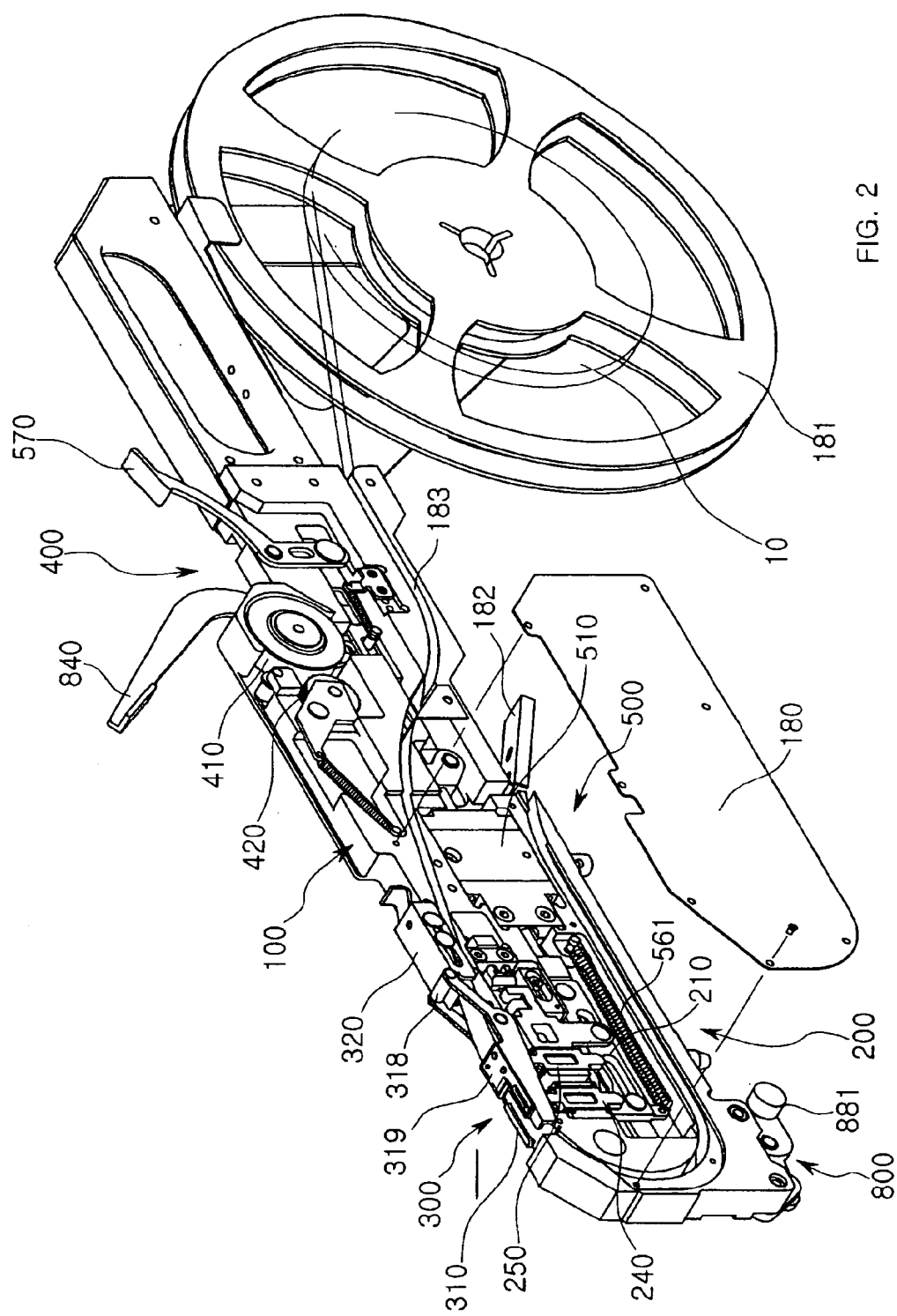
FIG. 2 is a perspective view of a tape feeder according to the present invention, in which a cover plate is separated from a body of the tape feeder.
Figure 3:
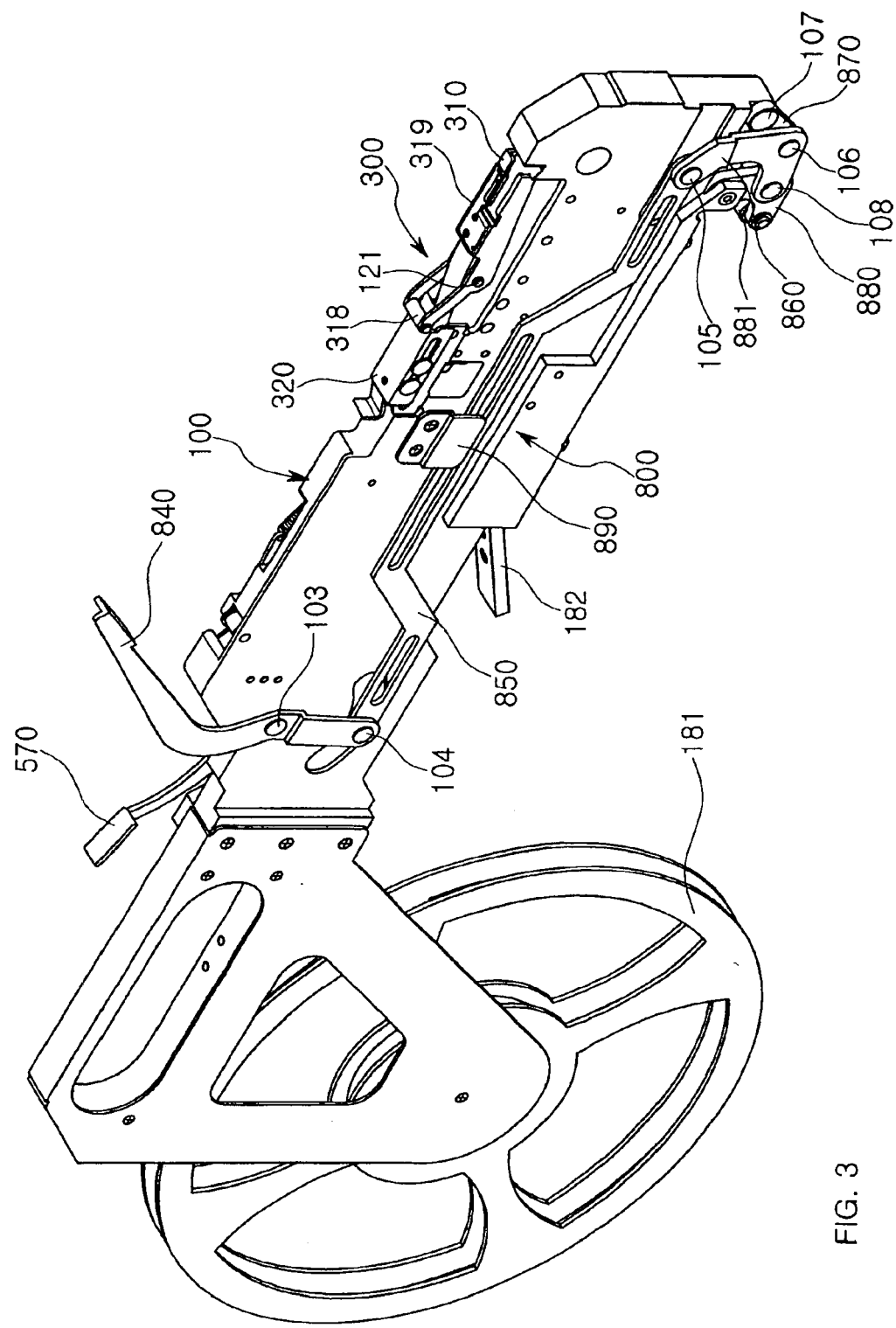
FIG. 3 is a perspective view of the tape feeder shown from a direction different from FIG. 2.
Figure 4:
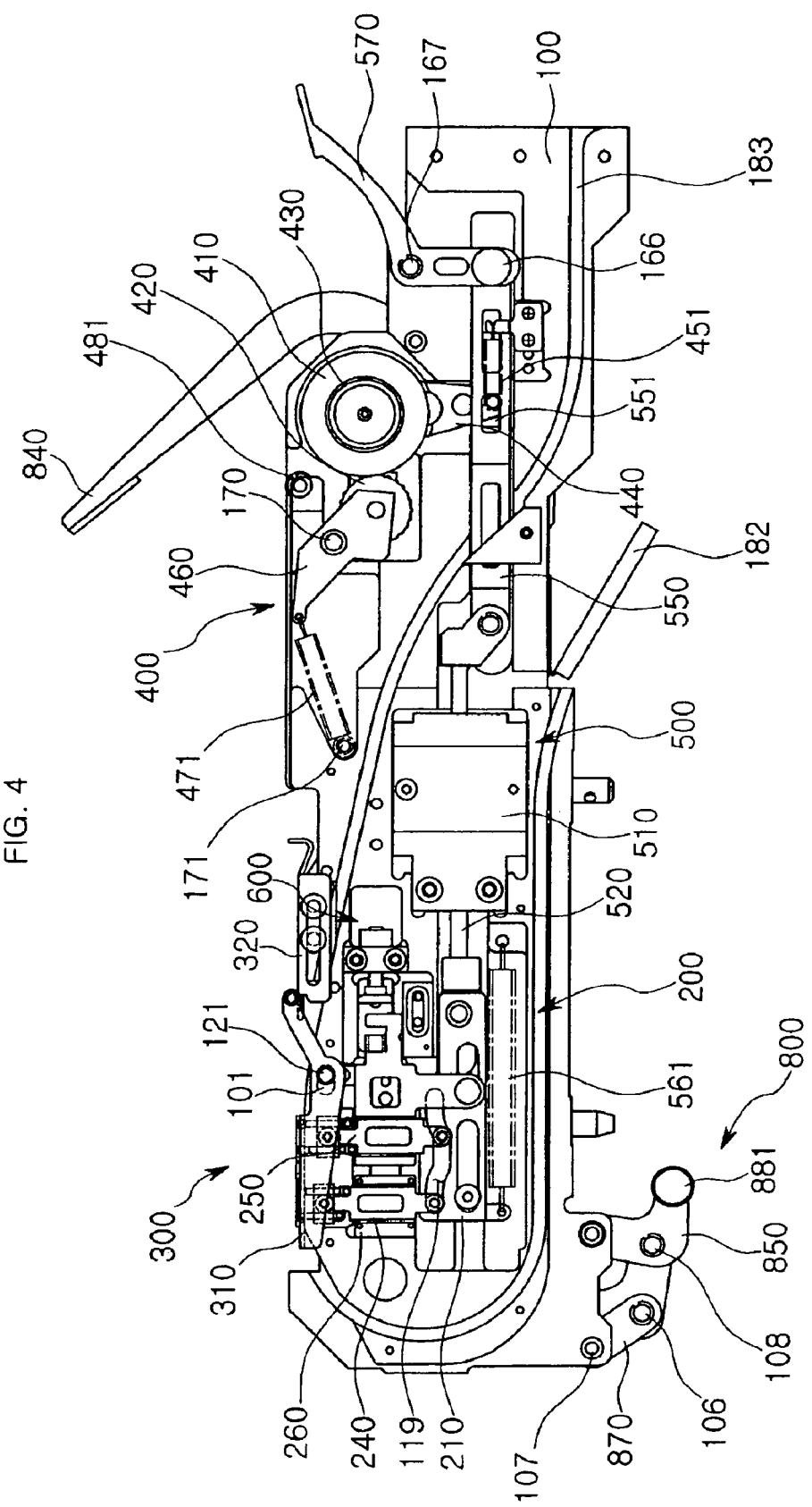
FIG. 4 is a side view of the tape feeder of FIG. 2, when the cover plate is separated from the body.
Figure 5:
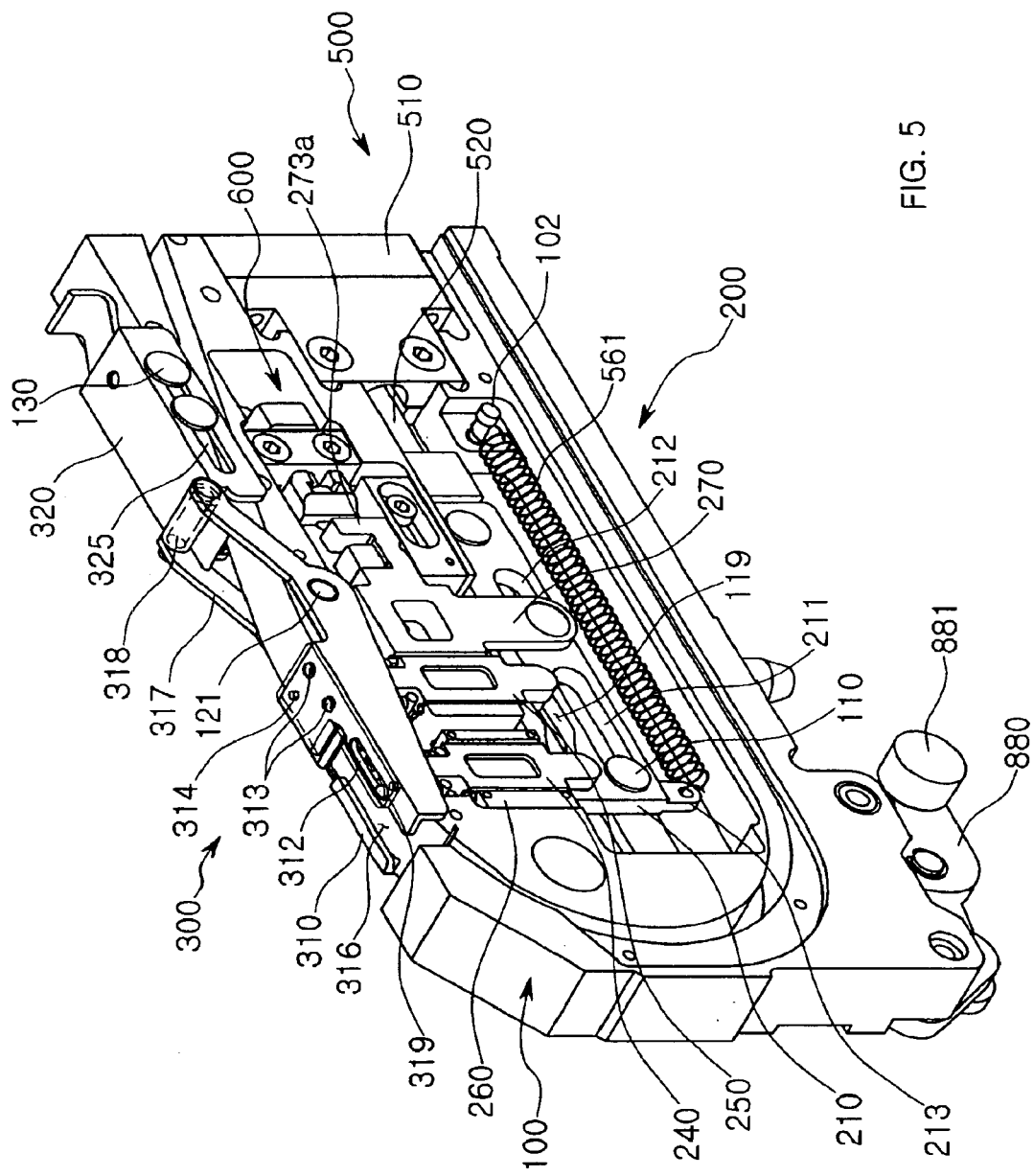
FIG. 5 is an enlarged perspective view of a front portion of the tape feeder of FIG. 2.
Figure 6:
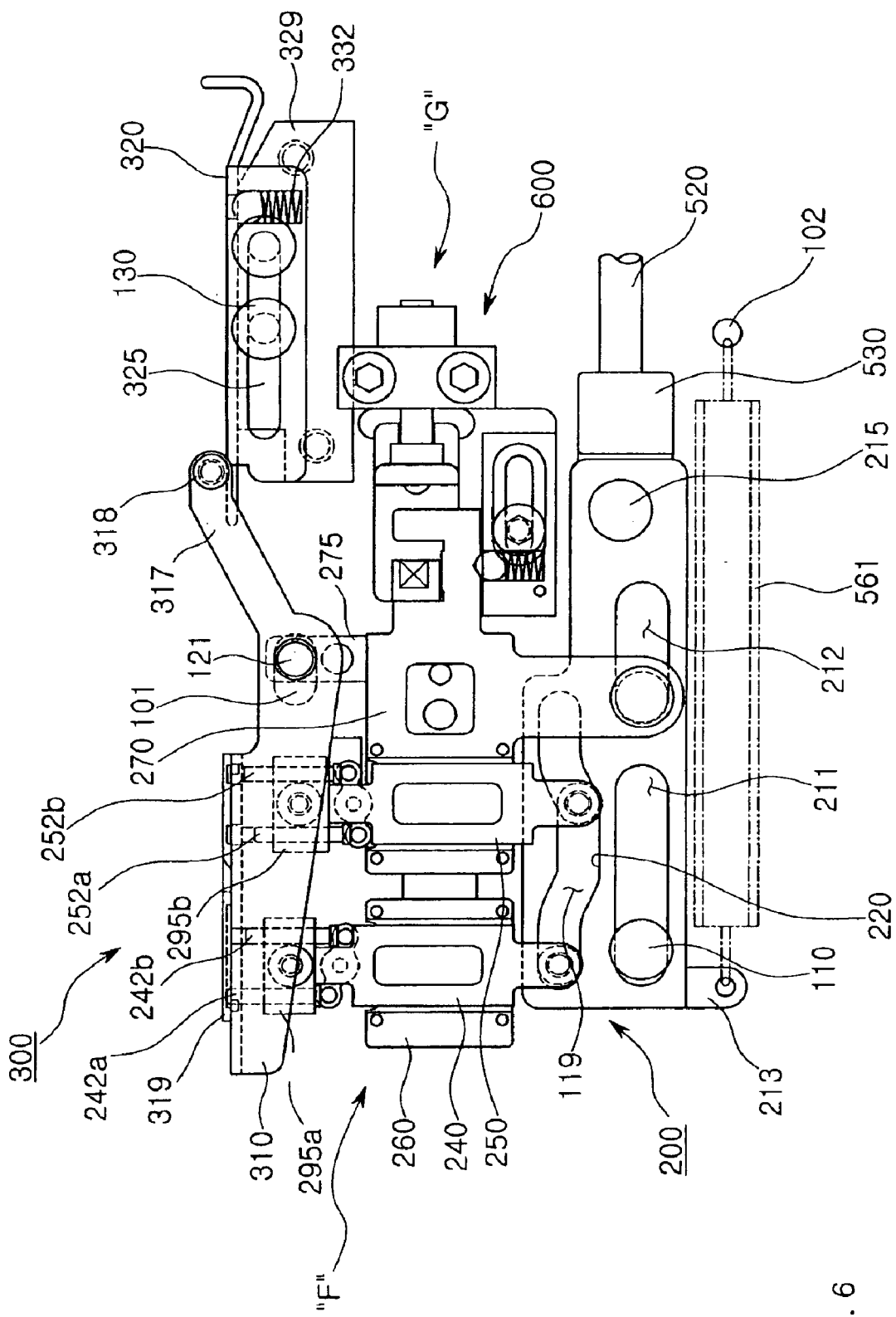
FIG. 6 is an enlarged side view to show a tape feeding unit and a gate unit included in the tape feeder of FIG. 2.
Figure 7:
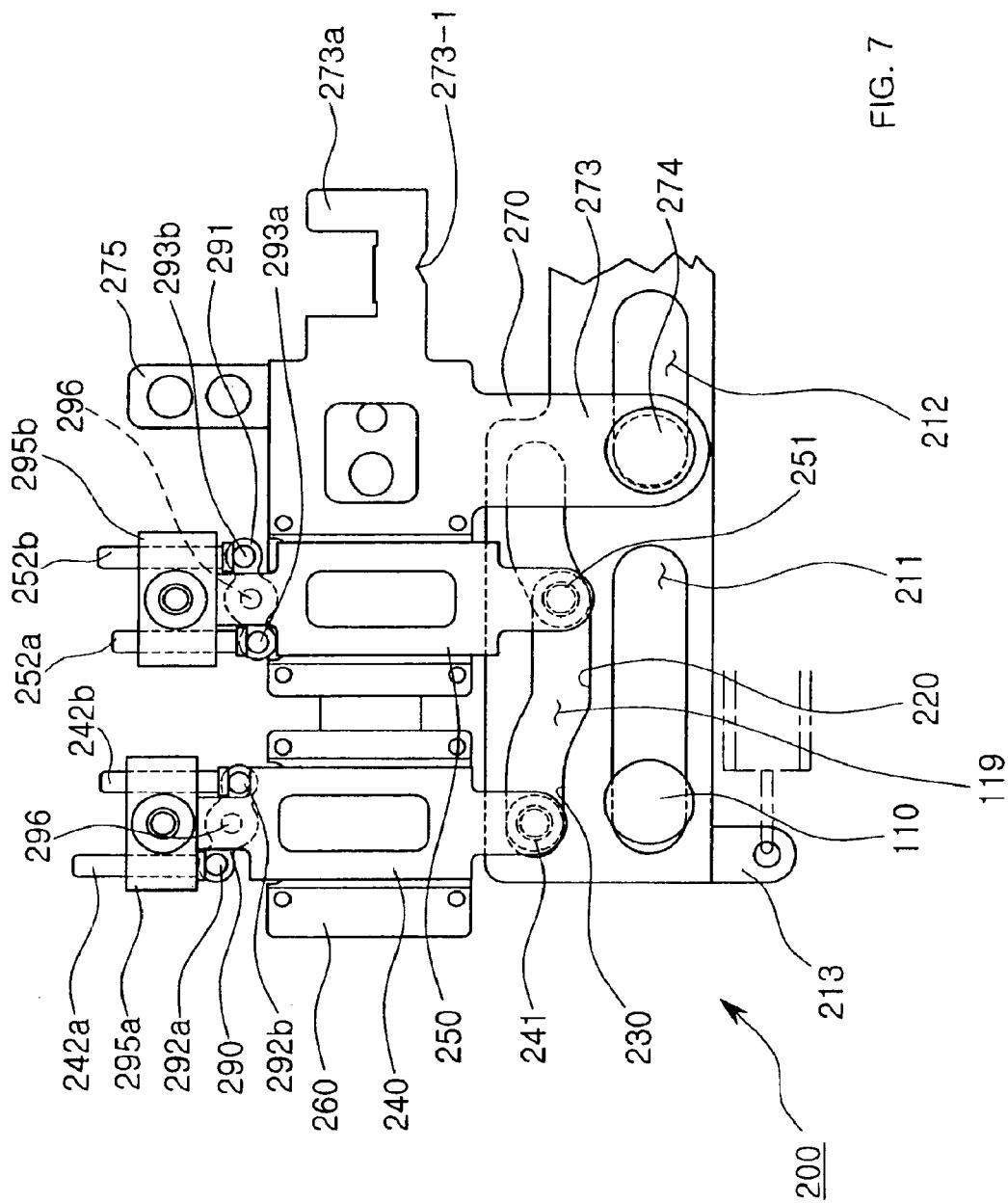
FIG. 7 is an enlarged view of a portion "F" of FIG. 6.
Figure 8:
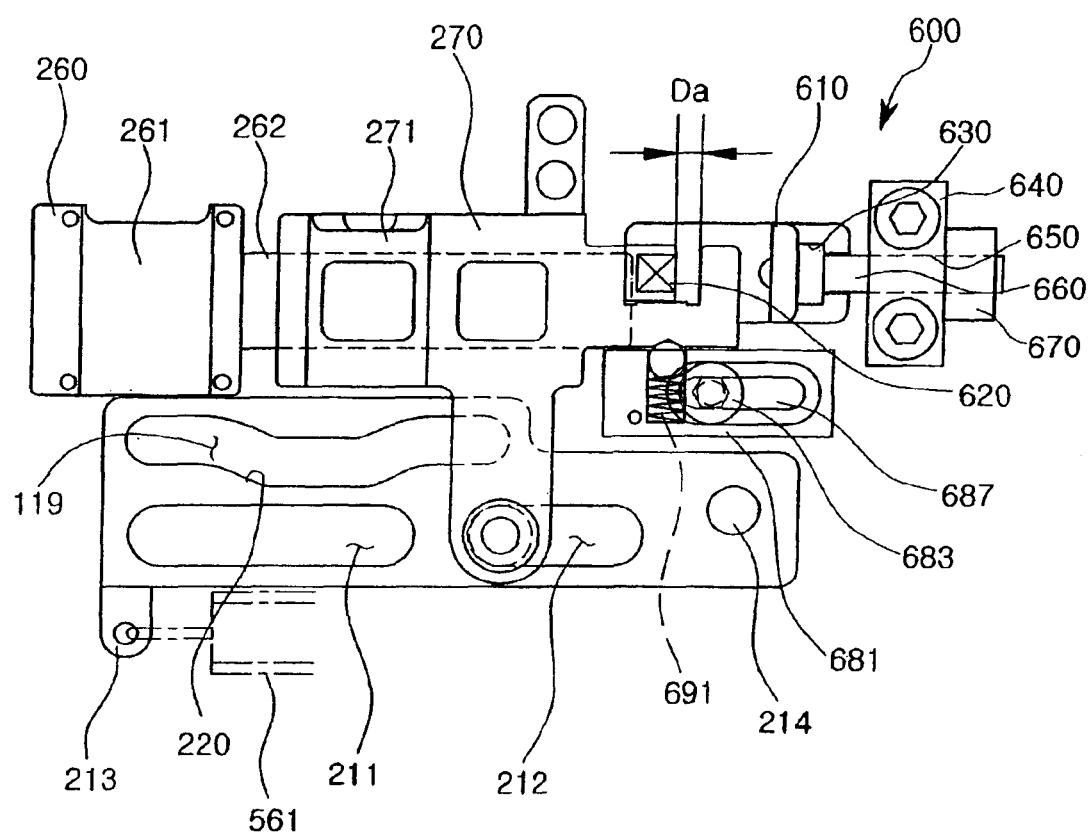
FIG. 8 is an enlarged view of a portion "G" of FIG. 6.
Figure 9:
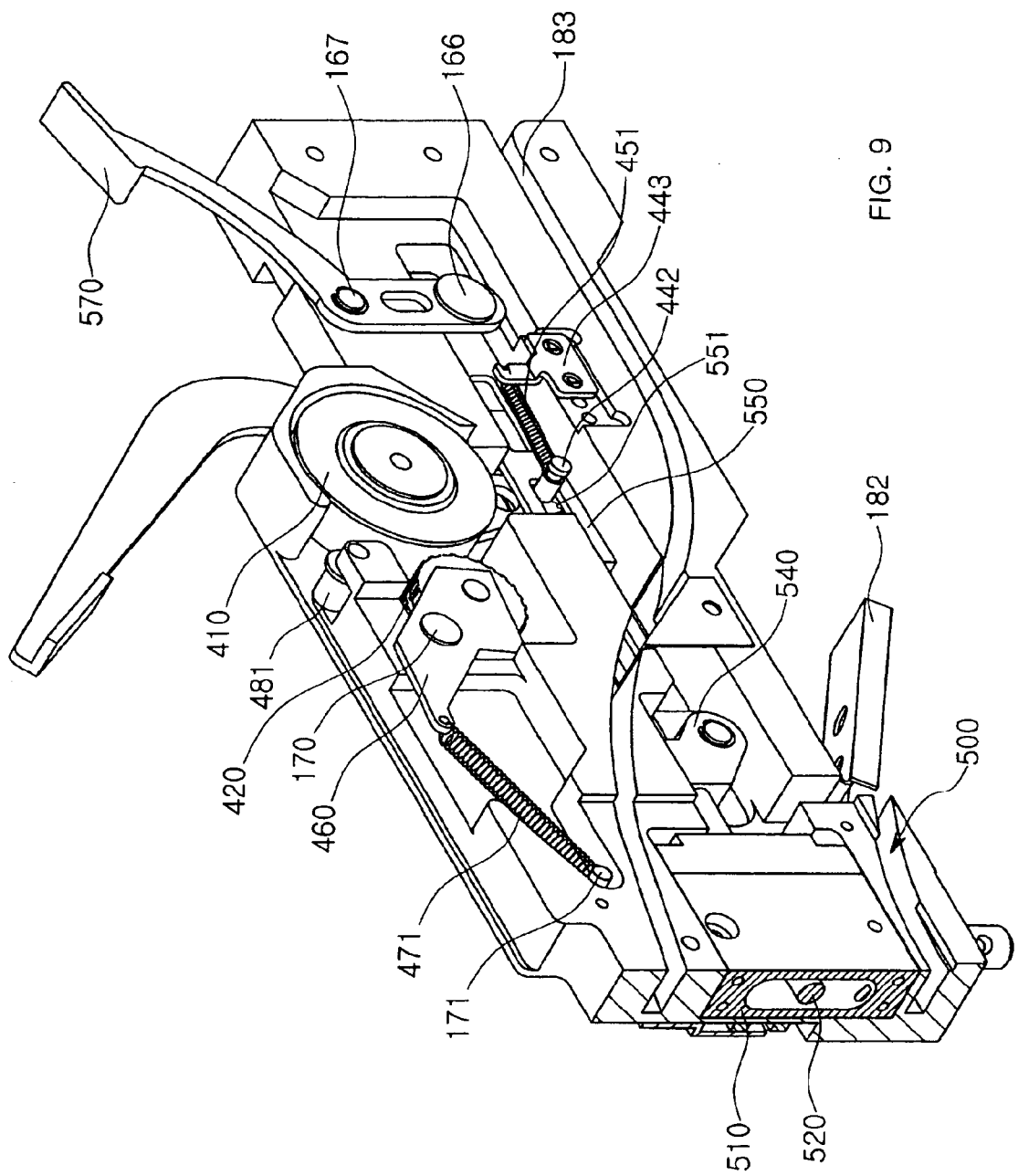
FIG. 9 is an enlarged perspective view of a rear portion of the tape feeder of FIG. 2.
Figure 10:
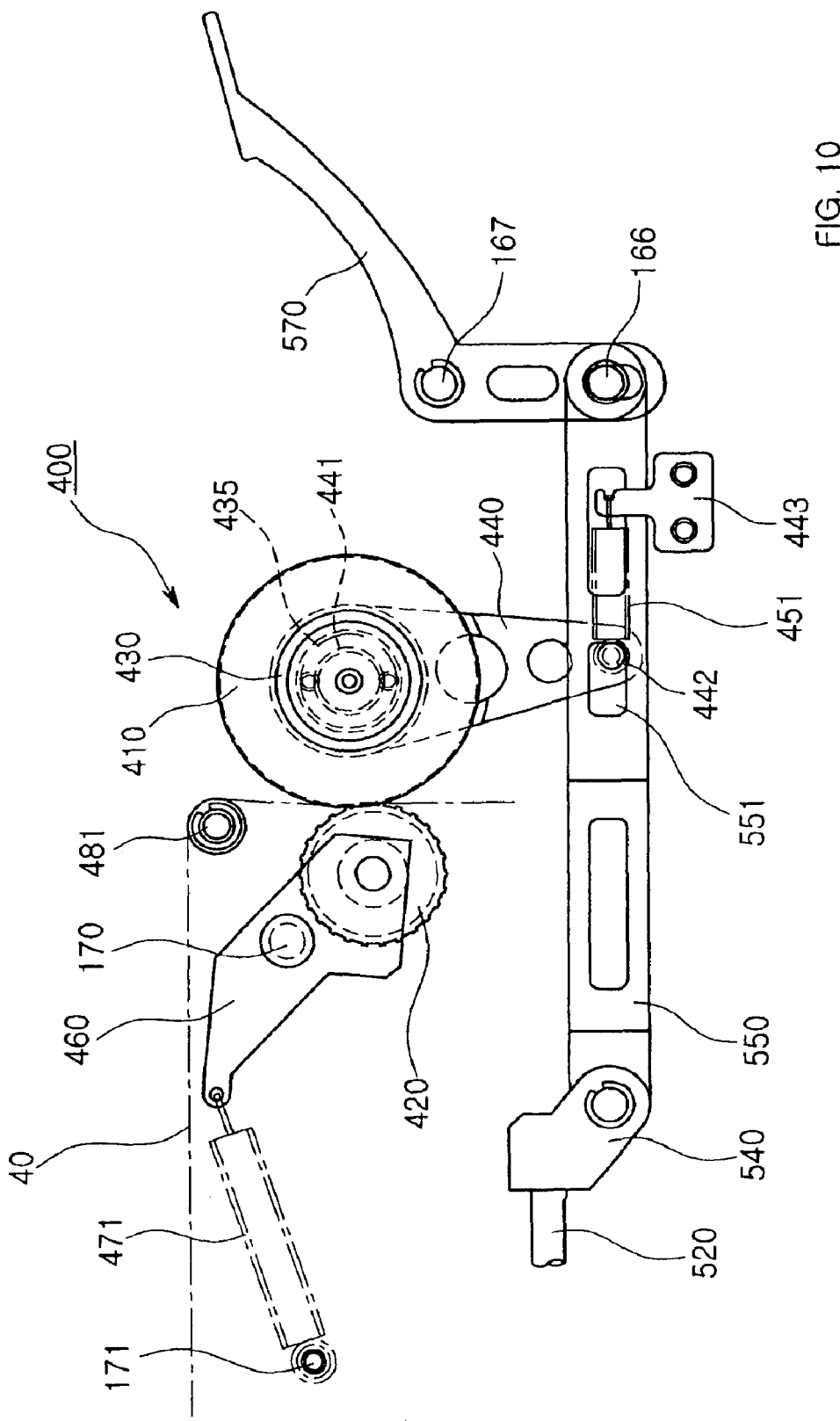
FIG. 10 is an enlarged side view to show a drive unit and a vinyl cover discharging unit included in the tape feeder of FIG. 2.
Figure 11:
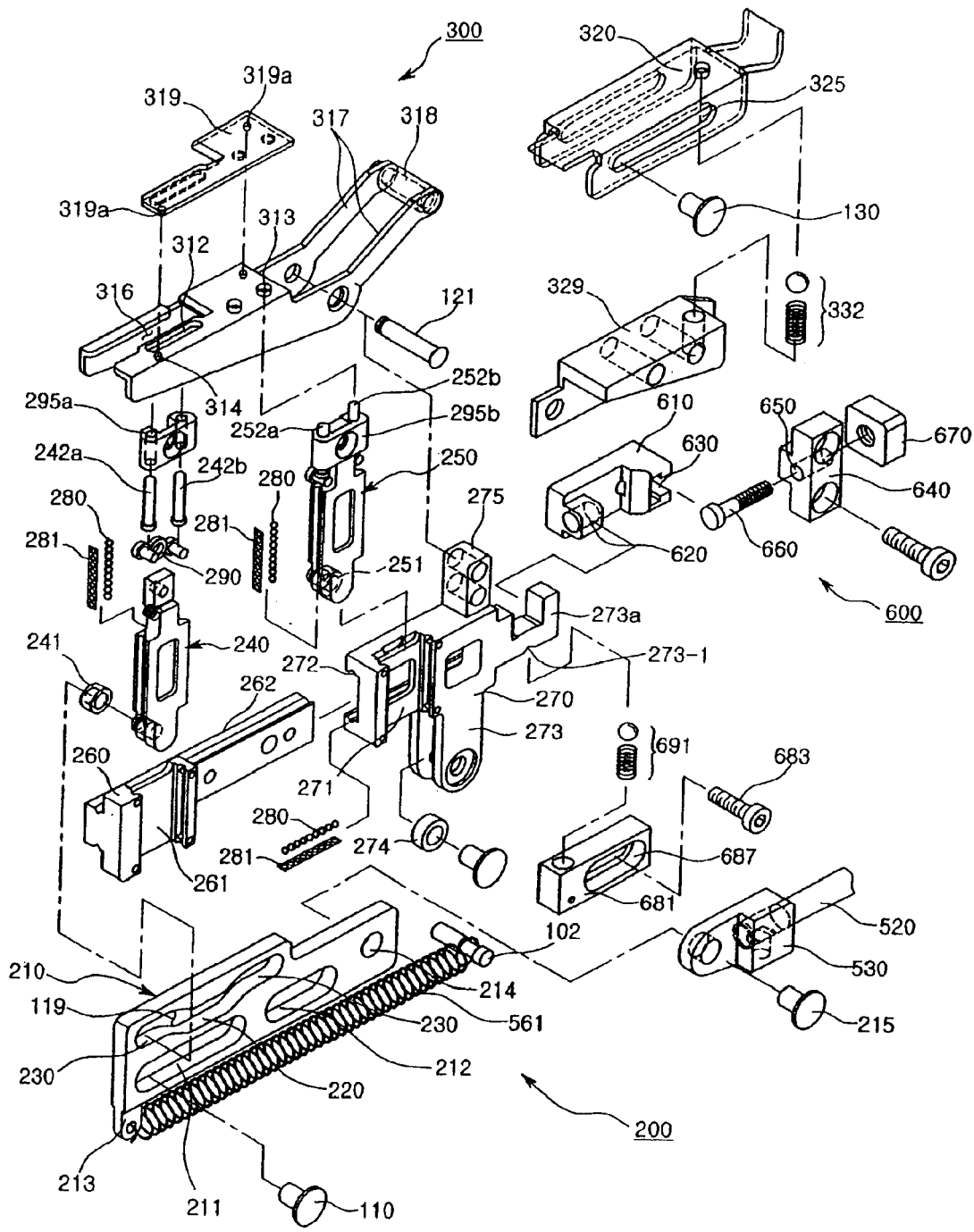
FIG. 11 is an exploded perspective view of elements of the tape feeding unit and the gate unit shown in FIG. 6.
Figure 12:
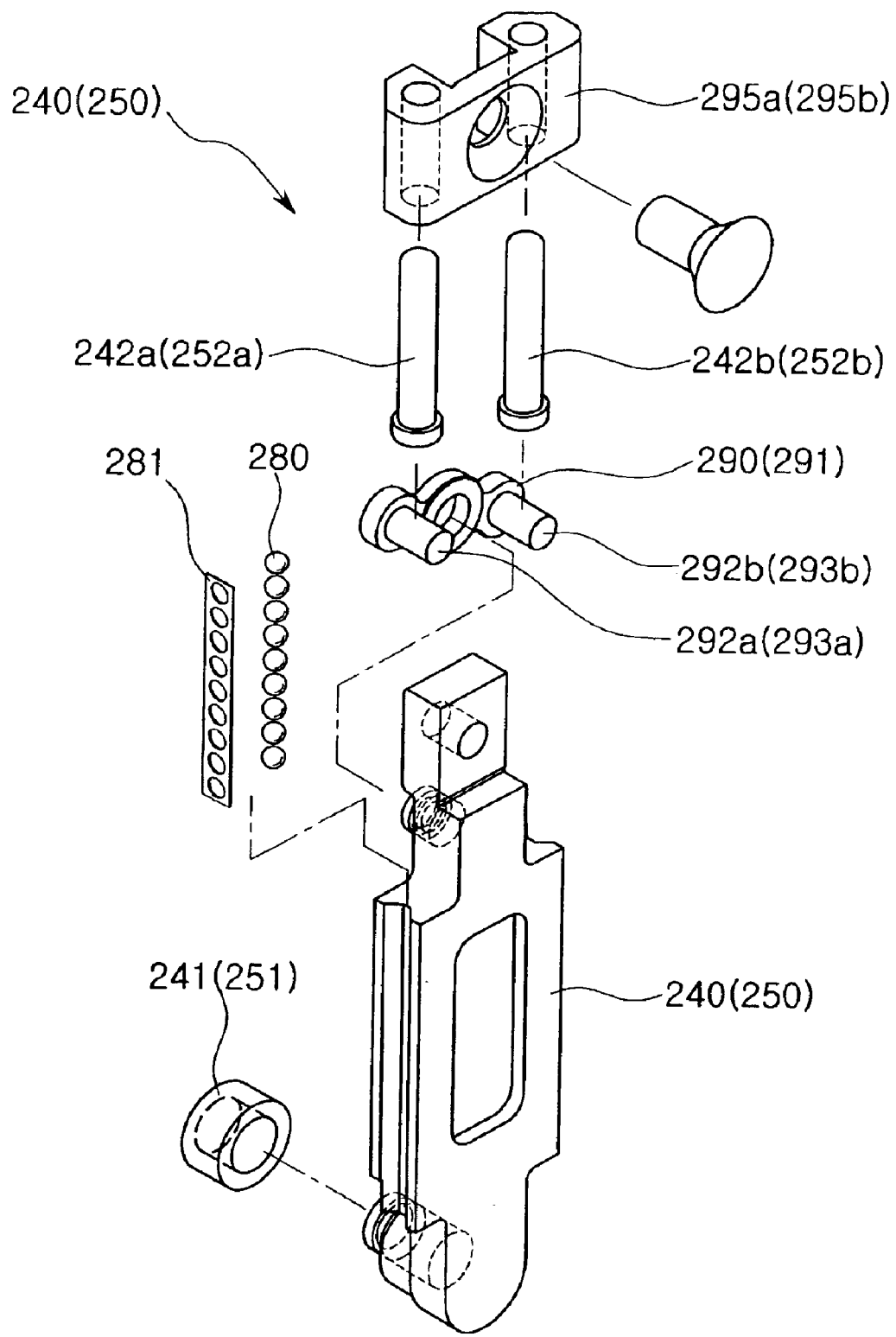
FIG. 12 is an exploded perspective view to show elements of a locator included in the tape feeding unit of FIG. 11.
Figure 13:
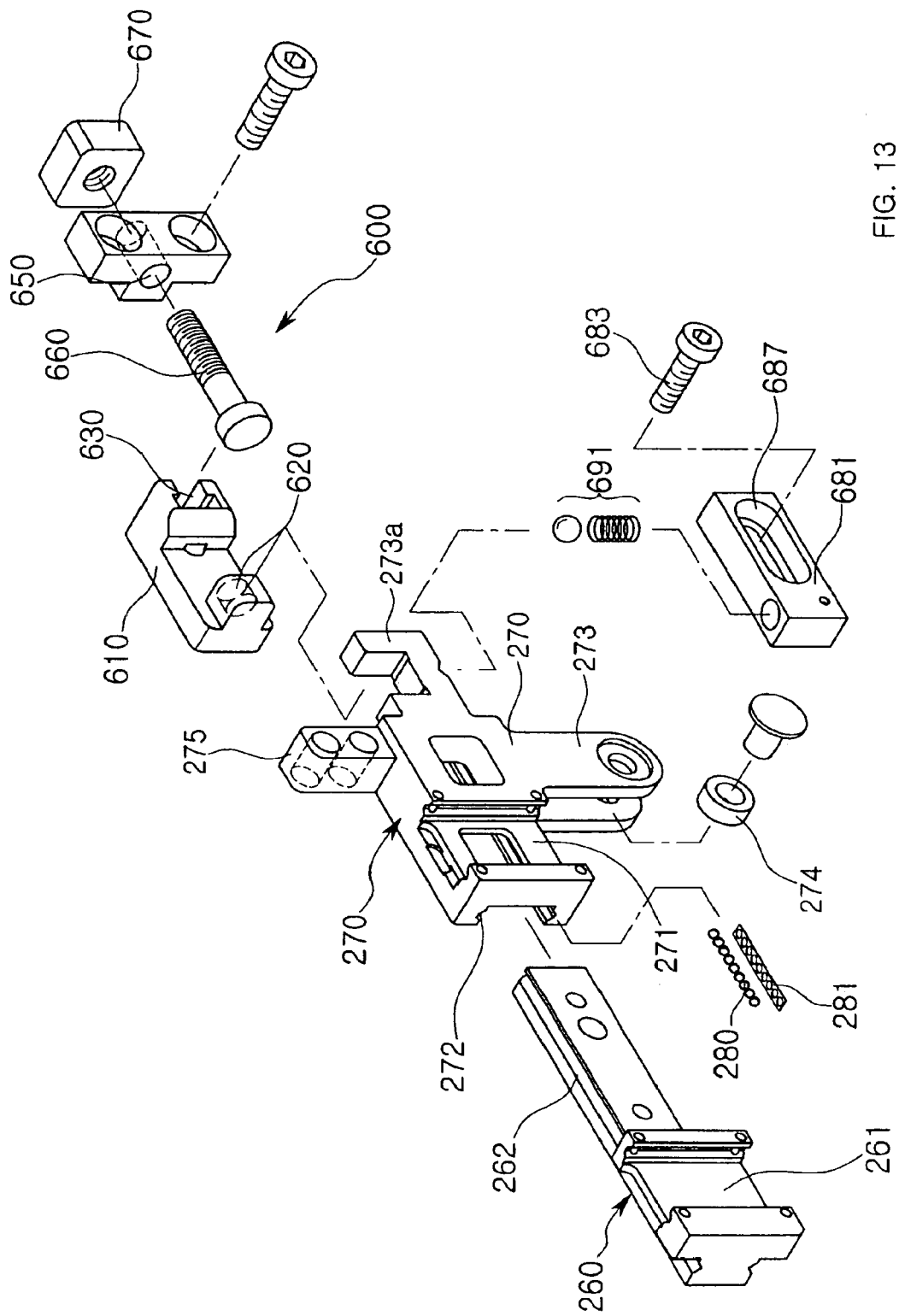
FIG. 13 is an exploded perspective view to show a movable rail and a pitch adjusting unit included in the tape feeder of FIG. 2.
Figure 14:
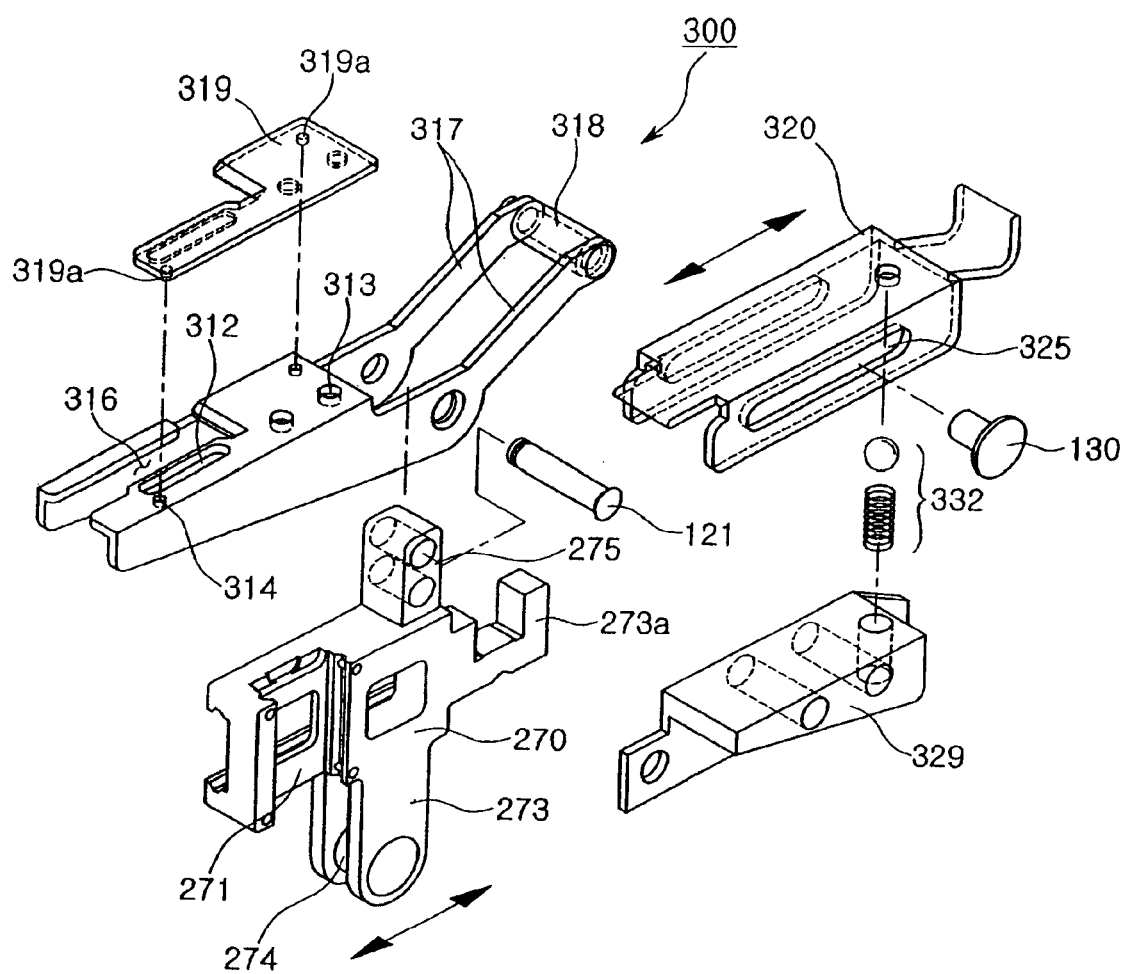
FIG. 14 is an exploded perspective view of elements of the gate unit of FIG. 6.
Figure 15:
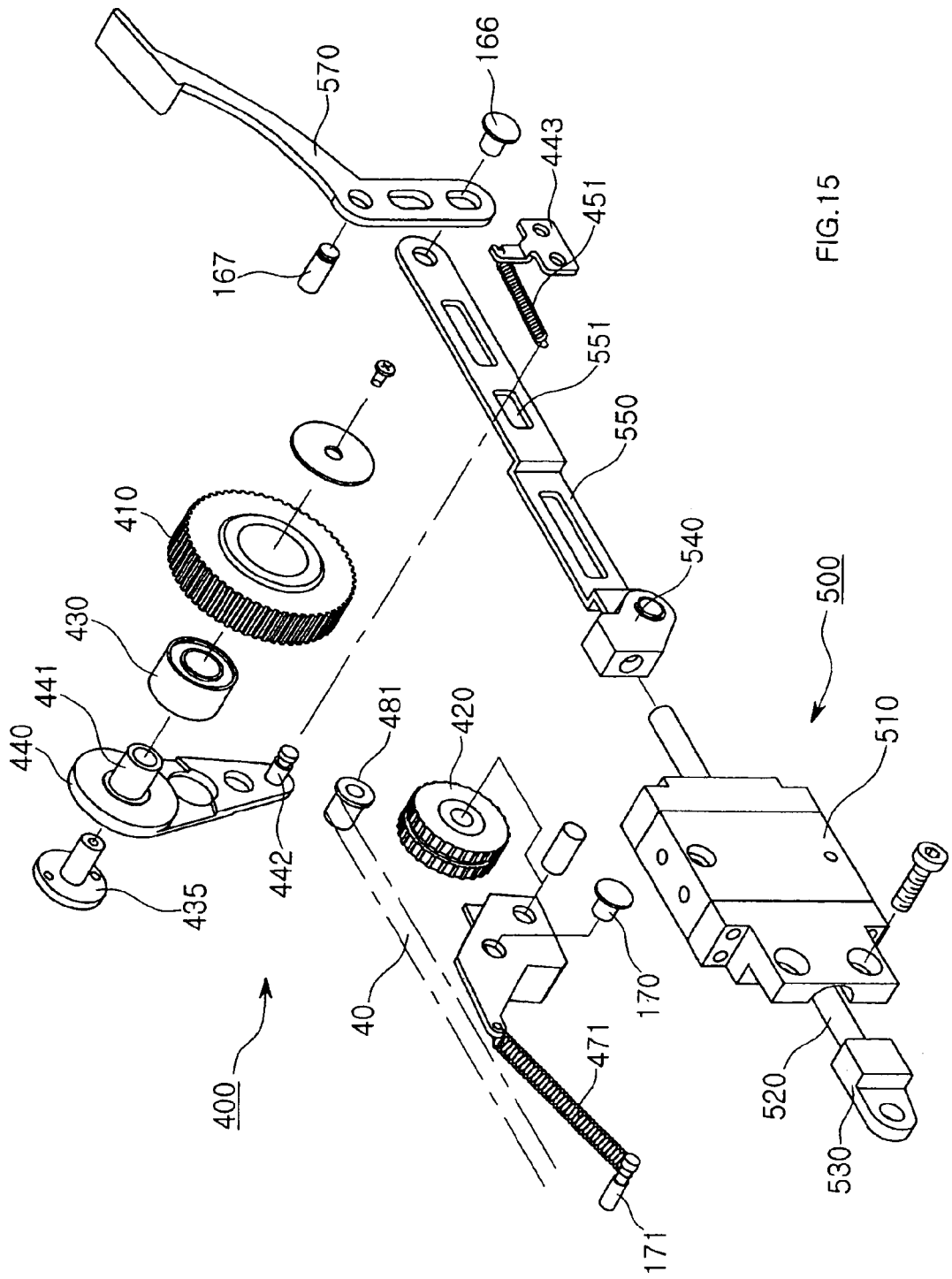
FIG. 15 is an exploded perspective view of elements of the vinyl cover discharging unit of FIG. 10.

Hereinafter, embodiments of the present invention will be described in detail with reference to the attached drawings.

Reference now should be made to the drawings, in which the same reference numerals are used throughout the different drawings to designate the same or similar components.

As shown in FIGS. 2 through 15, a tape feeder for chip mounters includes a tape feeding unit 200, a gate unit 300, a vinyl cover discharging unit 400, and a drive unit 500. The tape feeding unit 200 is provided at a front portion of a body 100 which is mounted to a chip mounter, and feeds a carrier tape 10 by a predetermined pitch. The gate unit 300 functions to mount the carrier tape 10 and supports the carrier tape 10 when the carrier tape 10 is fed. The vinyl cover discharging unit 400 includes first and second discharging gears 410 and 420, so that a vinyl cover 40 peeled from the carrier tape 10 is discharged while passing through the first and second discharging gears 410 and 420. The drive unit 500 drives the tape feeding unit 200 and at least one of first and second discharging gears 410 and 420, simultaneously.

The tape feeding unit 200 includes a cam slider 210 which has a restraint slot 119 and reciprocates horizontally. The restrain slot 119 has a concave cam section 220 and convex cam sections 230. Front and rear locators 240 and 250 move up and down while coming into contact with the concave cam section 220 and the convex cam sections 230 of the restraint slot 119 by the reciprocating motion of the cam slider 210. Pin holders 295a and 295b are provided at upper portions of the front and rear locators 240 and 250, respectively. Front lock pins 242a and 242b and rear lock pins 252a and 252b are fitted into the pin holders 295a and 295b, respectively, to move up and down. A front seesaw link 290 includes base pins 292a and 292b to support the lower surfaces of the front lock pins 242a and 242b, and a rear seesaw link 291 includes base pins 293a and 293b to support the lower surfaces of the rear lock pins 252a and 252b. In this case, each of the front and rear seesaw links 290 and 291 is rotatably mounted by a shaft pin 296 which is projected from a rear surface of each of the front and rear locators 240 and 250. A fixed rail 260 is mounted to a predetermined portion of the body 100 to guide the vertical movement of the front locator 240. A movable rail 270 guides the vertical movement of the rear locator 250, and is coupled to the cam slider 210 to be moved in a horizontal rail section 262 of the fixed rail 260 by a feeding pitch of the carrier tape 10. A pitch adjusting unit 600 is mounted to a predetermined portion of the body 100 to limit a moving distance of the movable rail 270.

The cam slider 210 includes a guide slot 211 and a feeding slot 212 under the restraint slot 119. In this case, the guide slot 211 and the feeding slot 212 are coupled to a support pin 110 fastened to the body 100 and the movable rail 270, respectively, to guide the reciprocating motion of the cam slider 210. A bracket 213 is projected from a lower surface of a front portion of the cam slider 210. A tension spring 561 is connected at a first end thereof to the body 100 and at a second end thereof to the bracket 213. A pin insert hole 214 is formed in a rear portion of the cam slider 210 to be coupled to an actuating rod 520 of an air cylinder 510 of the drive unit 500 via a coupling pin 215.

At this time, the actuating rod 520 is biased backward by a tensile force of the tension spring 561 while a compressed air does not flow into the air cylinder 510.

The front and rear locators 240 and 250 include roller bearings 241 and 251, respectively. The roller bearings 241 and 251 are mounted to shaft pins projected from the lower portions of the front and rear locators 240 and 250, respectively, to slide along the concave and convex cam sections 220 and 230 of the restraint slot 119 while being restrained by the restraint slot 119. The plurality of front lock pins 242a and 242b are arranged at regular intervals, that is, 6 mm, to vertically move in a vertical rail section 251 of the fixed rail 260, and the plurality of rear lock pins 252a and 252b are arranged at regular intervals, that is, 6 mm, to vertically move in a vertical rail section 271 of the movable rail 270.

The pin holders 295a and 295b, mounted to the upper portions of the front and rear locators 240 and 250 in a screw-type fastening method, are made of a ceramic material, thus providing high abrasion resistance and lubrication to the front and rear lock pins 242a, 242b, 252a, and 252b, therefore ensuring smooth and precise vertical movement of the front and rear lock pins 242a, 242b, 252a, and 252b.

The movable rail 270 is mounted to move to a horizontal rail section along the horizontal rail section 262 of the fixed rail 260. A vertical arm 273 is downwardly projected from a predetermined portion of the movable rail 270, and is coupled to the feeding slot 212 of the cam slider 210 by a support roll 274 so that the vertical arm 273 slides along the feeding slot 212.

A plurality rolling balls 280 are provided along each of guide grooves of the front locator 240 movably installed in the vertical rail section 261 of the fixed rail 260, guide grooves of the rear locator 250 movably installed in the vertical rail section 271 of the movable rail 270, and guide grooves of the movable rail 270 movably installed in the horizontal rail section 260, while the rolling balls 280 being enclosed in a ball cage 281 which is made of a resin material, thus minimizing friction due to the vertical movement of the front and rear locators 240 and 250 and the horizontal movement of the movable rail 270. Further, the ball cage 281 reduces friction between the rolling balls 280, thus reducing noise to a minimum.

Further, a locking arm 273a is projected from a predetermined portion of the movable rail 270, and the horizontal movement of the movable rail 270 is limited by the pitch adjusting unit 600 which is mounted to a predetermined portion of the body 100.

The pitch adjusting unit 600 includes a stopper 610, a screw holder 640, an adjusting bolt 660, and a locking nut 670. The stopper 610 includes a protrusion to receive a magnet 620 which is seated in the locking arm 273a of the movable rail 270, and is mounted to the body 100 to horizontally move. The screw holder 640 is fastened to the body 100 using a bolt. The adjusting bolt 660 is screwed to a screw hole 650 of the screw holder 640 so that a head of the adjusting bolt 660 is seated in a fitting recess 630 which is provided in a rear portion of the stopper 610. The locking nut 670 locks the adjusting bolt 660.

The pitch adjusting unit 600 is operated as follows. That is, as the adjusting bolt 660 is tightened, the stopper 610 moves forward and backward, thus limiting the moving distance of the movable rail 270. Thereby, an interval between the front and rear locators 240 and 250 is adjusted, so that an interval between the lock pin 242b of the front locator 240 and the lock pin 252a of the rear locator 250 is adjusted.

In this case, a stop notch 273-1 is formed on a bottom of the locking arm 273a, and a slip preventing unit 681 is fastened to a predetermined portion of the body 100 under the stop notch 273-1 by inserting a bolt 683 into a longitudinal hole 687 of the slip preventing unit 681. A ball plunger 691 having a spring and a ball is placed in the slip preventing unit 681 to elastically bias the ball to the stop notch 273-1, thus preventing the movable rail 270 from slipping when the movable rail 270 is moved backward.

Further, the stopper 610 is coupled to the locking arm 273a of the movable rail 270 while the magnet 620 of the stopper 610 being received in the protrusion of the stopper 610 so that a distance Da between the magnet 620 and the locking arm 273a of the movable rail 270 is equal to a pitch Pa between feeding holes 50 of the carrier tape 10.

The gate unit 300 includes a gate cover 310, a locking guide 320, and a guide support unit 329. The gate cover 310 is mounted to rotate and move forward and backward by a shaft pin 121 fitted into a guide hole 101 which is formed through an upper end of the body 100. The gate cover 310 is used to mount the paper tape 20 of the carrier tape 10 and to guide the vinyl cover 40. The locking guide 320 having a longitudinal slot 325 is mounted to a predetermined portion of the body 100 by a support pin 130 passing through the slot 325, thus moving along the slot 325, and keeps the gate cover 310 closed. The guide support unit 329 supports the locking guide 320, with a ball plunger 332 having a compression spring and a ball and being placed in the guide support unit 329 so as to lock the locking guide 320 in a vertical direction.

The gate cover 310 is coupled to the movable rail 270 by inserting the shaft pin 121 into both the guide hole 101 of the body 100 and a hole of a coupling projection 275 which is upwardly projected from the movable rail 270, so that the gate cover 310 moves forward and backward by the moving distance of the movable rail 270.

The gate cover 310 includes a large locking hole 312 through which the front lock pins 242a and 242b pass, and small locking holes 313 through which the rear lock pins 252a and 252b pass. Further, two mount holes 314 are formed on both sides of the gate cover 310 at diagonally opposite positions. A picking hole 316 is formed along a part of the gate cover 310 to be placed near the large locking hole 312. Two support arms 317 are provided on both sides of a rear portion of the gate cover 310 to be upwardly inclined at a predetermined angle, and a guide roller 318 is provided between the support arms 317 to guide the discharge of the vinyl cover 20. Further, a dust cover 319 is assembled to cover the large locking hole 312 and the small locking holes 313.

The gate cover 310 is operated as follows so as to mount the carrier tape 10 at first. That is, the locking guide 320 is moved backward so that the support arms 317 coupled to the guide roller 318 rotate downward. In such a state, the carrier tape 10 is mounted to the tape feeder.

Two mount projections 319a are downwardly projected from the dust cover 319 to correspond to the mount holes 314 of the gate cover 310. Thus, the dust cover 319 is detachably mounted to the gate cover 310 using the mount holes 314 and the mount projections 319a. Further, the dust cover 319 includes depressions to receive upper ends of the front lock pins 242a and 242b passing through the large locking hole 312 and upper ends of the rear lock pins 252a and 252b passing through the two small locking holes 313.

The dust cover 319 is manufactured using a transparent resin material, such as an acrylic resin, thus allowing the front and rear lock pins 242a, 242b, 252a, and 252b to be confirmed by the naked eyes from an outside.

The vinyl cover discharging unit 400 includes an index link 440, a first discharging gear 410, a tension spring 451, a rotary bracket 460, a second discharging gear 420, and a guide roller 481. The index link 440 is coupled at a center shaft 441 thereof to a pinion hinge 435 which is screwed to the body 100. The first discharging gear 410 is coupled to a one-way clutch bearing 430 which is assembled with the center shaft 441 of the index link 440. The tension spring 451 is supported at a first end thereof to a support pin 442 of the index link 440 and at a second end thereof to a hook piece 443 which is screwed to the body 100. In this case, the support pin 442 passes through a slot 551 of a slide link 550 of the drive unit 500 to transmit power. The rotary bracket 460 is mounted to the body 100 using a shaft pin 170. In this case, the shaft pin 170 is connected to another tension spring 471 which is connected at a first end thereof to a hook pin 171 mounted to a predetermined portion of the body 100, so that the rotary bracket 460 is upwardly biased. The second discharging gear 420 is coupled to an end of the rotary bracket 460 to engage with the first discharging gear 410. The guide roller 481 is mounted to a predetermined portion of the body 100 to guide the vinyl cover 40 between the first and second discharging gears 410 and 420.

In this case, the index link 440 is rotated so that the support pin 442 elastically connected to the tension spring 451 comes into contact with an inner surface of a rear portion of the slot 551 of the slide link 550 by a tensile force of the tension spring 451.

The drive unit 500 includes the double-acting air cylinder 510, a front joint 530, a rear joint 540, and the tension spring 561. The double-acting air cylinder 510 is mounted to a predetermined portion of the body 100. The front joint 530 is coupled to a front end of the actuating rod 520 to be coupled to the pin insert hole 214 of the cam slider 210 by the coupling pin 215. The rear joint 540 is coupled to a rear end of the actuating rod 520 of the air cylinder 510 to be coupled to the slide link 550 which transmits power from the air cylinder 510 to the index link 440. The tension spring 561 is connected at a first end thereof to the bracket 213 and at a second end thereof to a support pin 102 which is mounted to a predetermined portion of the body 110, to bias the actuating rod 520 backward.

In this case, the air cylinder 510 has a slim construction to allow the body 100 to be installed in a space having a width of 10 mm or less. Further, the air cylinder 510 comprises the slim double-acting cylinder of which an effective sectional area is not a circle but an ellipse, thus overcoming a drawback of the slim construction and thereby increasing a thrust.

The air cylinder 510 may comprise a single-acting cylinder which executes only a backward motion by a tensile force of the tension spring 561.

Further, the drive unit 500 includes a manual handle 570. The manual handle 570 is connected at an end thereof to a link pin 166 provided at a rear end of the slide link 550, and is rotated about a shaft pin 167 mounted to a predetermined portion of the body 100 so as to move the slide link 550 forward and backward. The manual handle 570 allows a feeding operation to be set when the carrier tape 10 is mounted at first, thus being convenience for a user.

In the present invention, a cover plate 180 is screwed to each side of the front portion of the body 100 to cover the front portion of the body 100, thus protecting the most important element of this invention, that is, the tape feeding unit 200, and preventing foreign materials, such as dust, from accessing the body 100.

Figure 16:
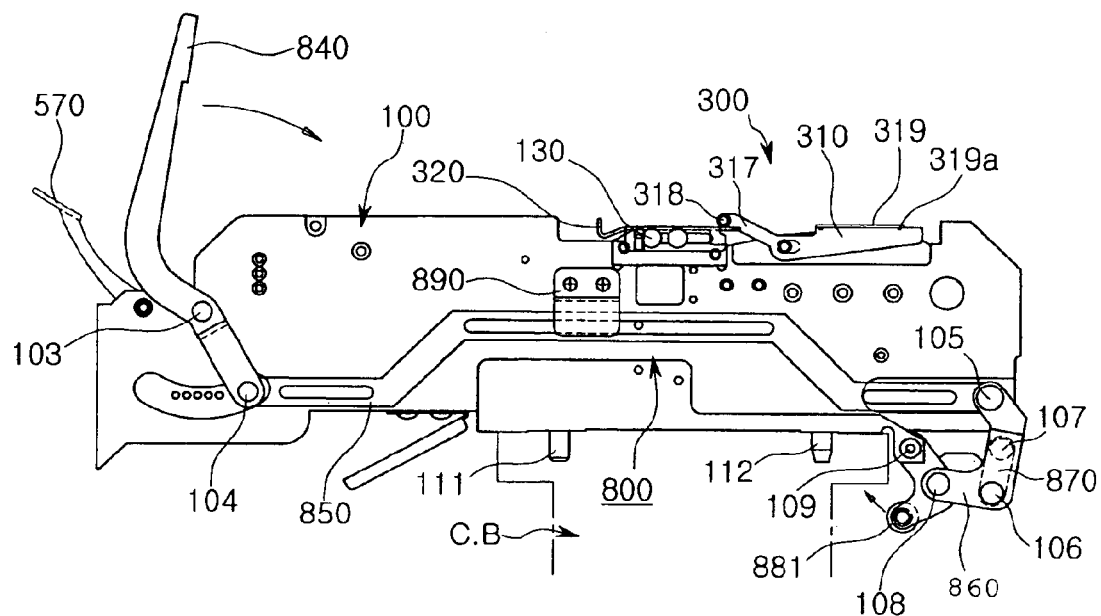
Figure 17:
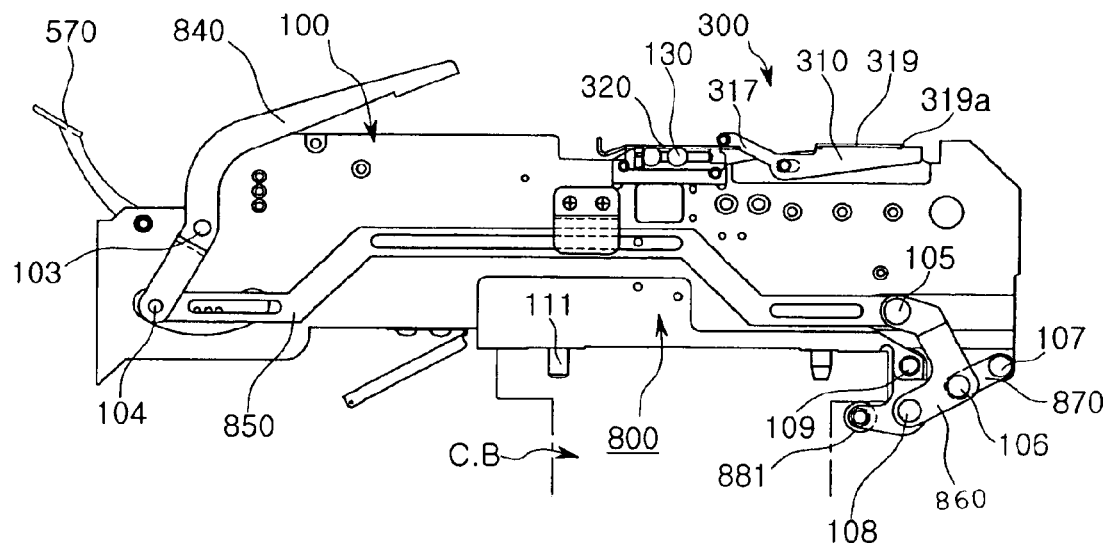

FIGS. 16 and 17 show a clamping unit 800 which is provided at surface of the body 100 and used to mount the tape feeder to a feeder base (C.B) of the chip mounter. In this case, a construction of a toggle joint having four links is applied to the clamping unit 800, thus allowing the tape feeder to be easily and conveniently mounted to the feeder base (C.B).

The clamping unit 800 includes a clamp lever 840, a connecting link 850, an interlocking link 860, a support link 870, and a clamping link 880. The clamp lever 840 is mounted to an intermediate portion of the body 100 by a shaft pin 103 to rotate about the shaft pin 103. The connecting link 850 is connected at a first end thereof to the clamp lever 840 by a shaft pin 104 to be horizontally placed along the body 100. The interlocking link 860 is connected at a first end thereof to a second end of the connecting link 850 by a shaft pin 105. The support link 870 is connected at a first end thereof to an intermediate portion of the interlocking link 860 by a shaft pin 106, and connected at a second end thereof to a predetermined portion of the body 100 by a shaft pin 107. The clamping link 880 is connected at an intermediate portion thereof to a second end of the interlocking link 860 by a shaft pin 108, and connected at an end thereof to a predetermined portion of the body 100, so that an end of the clamping link 880 clamps a projecting end of the feeder base (C.B).

In this case, since the connecting link 850 has a length extending from a front end to a rear end of the body 100, a link guide piece 890 is screwed to a predetermined portion of the body 100 to surround an outer surface of a part of the connecting link 850, so as to prevent loosening or malfunction of the connecting link 850 when the connecting link 850 moves forward and backward.

Further, a roller bearing 881 is mounted to the end of the clamping link 880 to prevent both the clamping link 880 and the feeder base (C.B) from being damaged when the projecting end of the feeder base (C.B) is clamped, thus ensuring a smooth clamping action.

Figure 18:
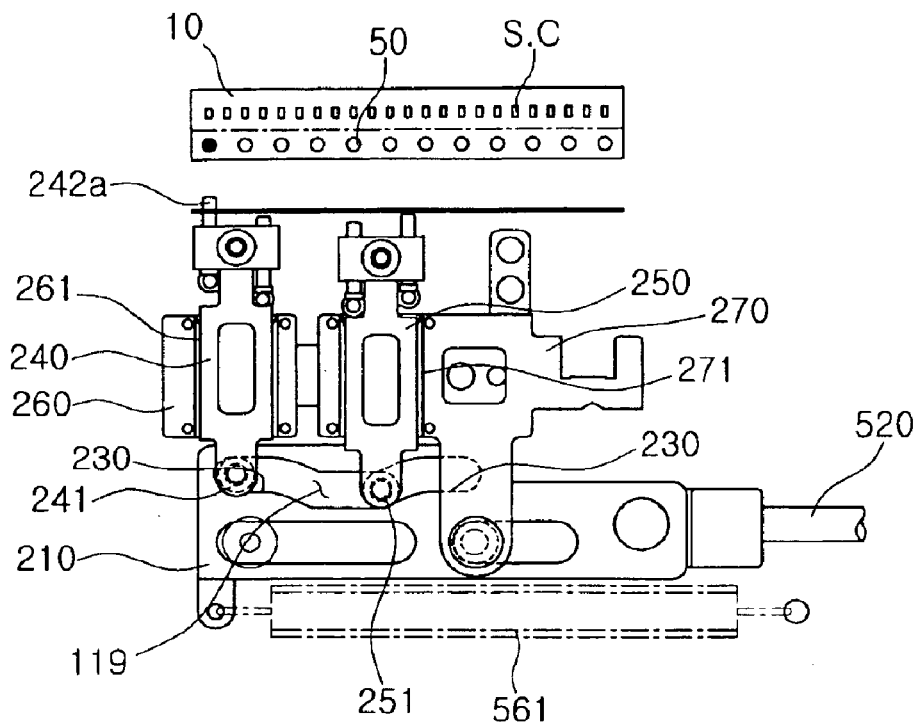

The clamping unit 800 is operated as follows. As shown in FIG. 17, a worker sets the position of the feeder base C.B by position setting pins 111 and 112 which are fixed to the bottom of the body 100. Subsequently, as shown in FIG. 18, the worker pushes the clamp lever 840 forward. At this time, the clamp lever 840 rotates about the shaft pin 103, so that the connecting link 850 connected to the end of the clamp lever 840 by the shaft pin 104 moves backward.

Further, a side of the interlocking link 860 connected to the end of the connecting link 850 moves backward while another side of the interlocking link 860 rotates forward. But, a side of the support link 870 which is connected at the first end thereof to the intermediate portion of the interlocking link 860 and connected at the second end thereof to the body 100 rotates forward. At this time, the clamping link 880 upwardly rotates about the shaft pin 109 mounted to the body 100, so that the roller bearing 881 mounted to the end of the clamping link 880 pushes the projecting end of the feeder base (C.B) upward while clamping the projecting end. The clamping unit 800 is released in reverse order.

The reference numeral 181 denotes a tape winding wheel around which the carrier tape 10 is wound, the reference numeral 182 denotes a tape discharging guide to guide the discharge of the paper tape 20 of the carrier tape 10, and the reference numeral 183 denotes a guide groove to draw the carrier tape 10.

The operation of the tape feeder according to the present invention will be described with reference to FIGS. 18 through 29.

FIG. 18 shows an initial stage where the carrier tape 10 is manually mounted to the tape feeder so as to be fed by a predetermined pitch.

First, the carrier tape 10 is unwound from the tape winding wheel 181 and drawn through the guide groove 183 of the body 100. Thereafter, the locking guide 320 of the gate unit 300 is moved backward, and the support arms 317 are pressed so that the front portion of the gate cover 310 is raised while rotating about the shaft pin 121. Thus, the carrier tape 10 passes through a space between the upper portion of the body 100 and the bottom of the gate cover 310. In this way, the carrier tape 10 is manually mounted to the tape feeder.

In such a mounting stage, the actuating rod 520 of the air cylinder 510 coupled to the cam slider 210 of the tape feeding unit 200 is completely biased backward by the tensile force of the tension spring 561 of the drive unit 500. At this time, the front locator 240 is placed in the vertical rail section 261 of the fixed rail 260 while the roller bearing 241 of the front locator 240 being restrained in the convex cam section 230 of the restraint slot 119, and the rear locator 250 is placed in the vertical rail section 271 of the movable rail 270 while the roller bearing 251 of the rear locator 250 being restrained in the concave cam section 220. The lock pin 242*a* of the front locator 240 passes through the feeding hole 50 of the carrier tape 10 to lock the carrier tape 10.

Figure 19:
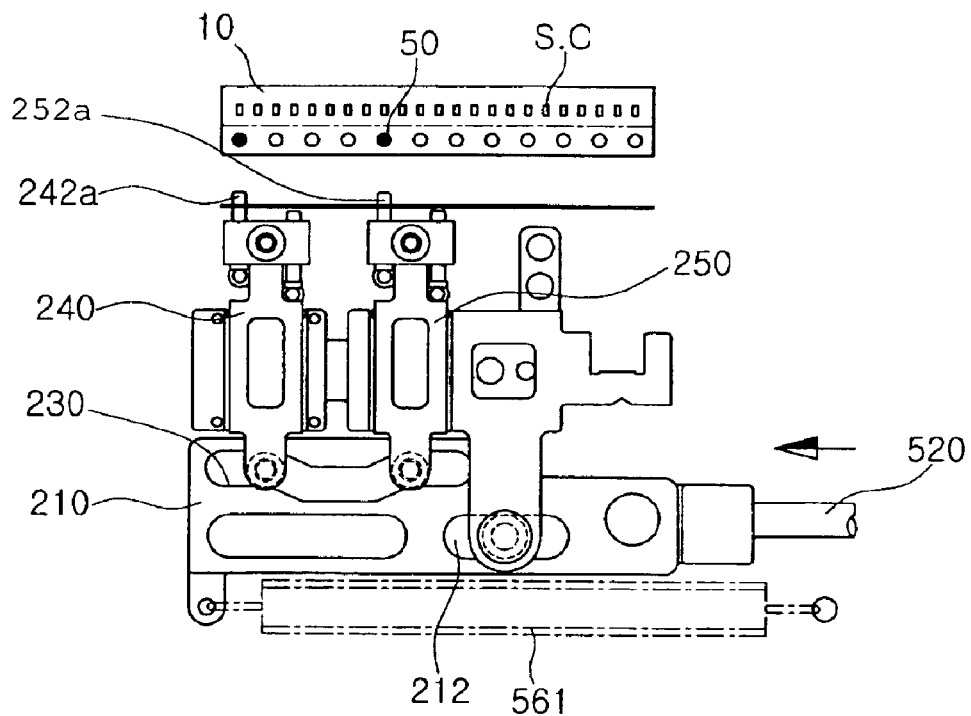

In the initial mounting stage, as shown in FIG. 19, when the cam slider 210 moves forward by power transmitted from an external power source (the chip mounter) or the air cylinder 510 of the drive unit 500, the front locator 240 horizontally slides along the restraint slot 119 while the roller bearing 241 being restrained in the convex cam section 230 of the restraint slot 119. At this time, the lock pin 242a is positioned so that the feeding hole 50 is locked by the lock pin 242a. Meanwhile, the rear locator 250 moves upward in the vertical rail section 271 of the movable rail 270 while the roller bearing 251 sliding from the concave cam section 220 to the convex cam section 230 of the restraint slot 119, so that the lock pin 252a of the rear locator 250 passes through the feeding hole 50 to lock the feeding hole 50.

Figure 20:
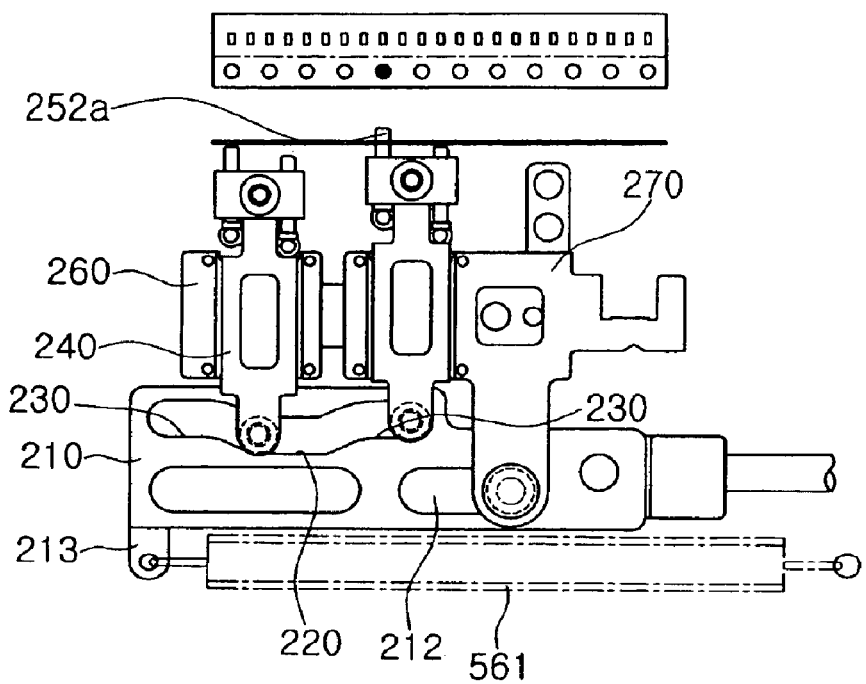

As shown in FIG. 20, when the cam slider 210 further moves forward in such a state, the front locator 240 slides from the convex cam section 230 to the concave cam section 220 while moving downward along the fixed rail 260, so that the lock pin 242a is removed from the feeding hole 50 of the carrier tape 10. Simultaneously, the rear locator 250 remains in the convex cam section 230 while the feeding hole 50 being locked by the lock pin 252a of the rear locator 250.

Figure 21:
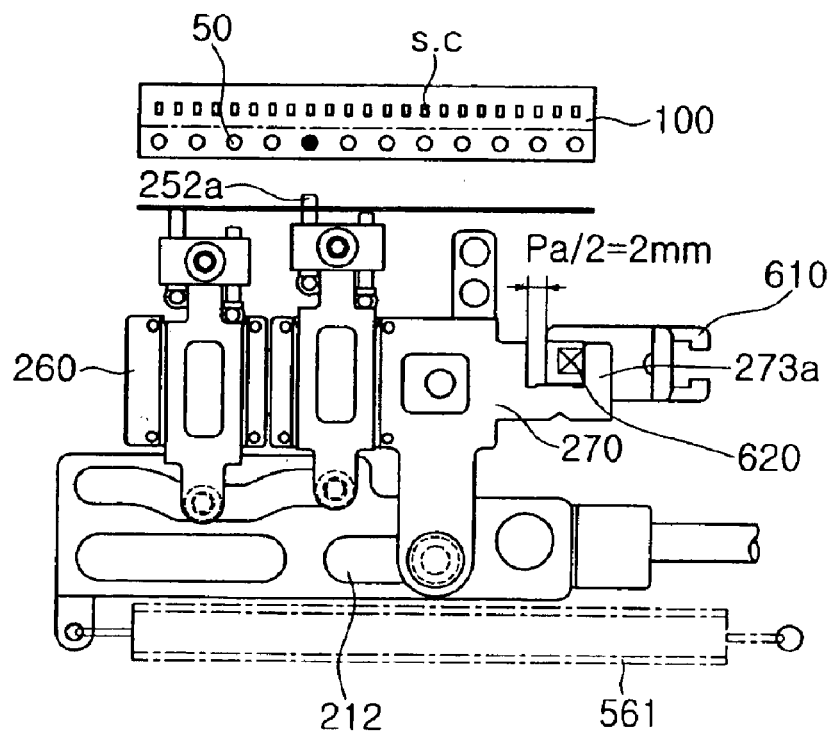

When the cam slider 210 further moves forward in such a state, as shown in FIG. 21, the tension spring 561 extends to the maximum and the movable rail 270 moves forward by the vertical arm 273 coupled to the feeding slot 212 of the cam slider 210 by the support roll 274. Simultaneously, the rear locator 250 moves along the horizontal rail section 262 of the fixed rail 260 by a half of a pitch Pa between the feeding holes 50 of the carrier tape 10, that is, 2 mm.

In this case, the tension spring 561 of the drive unit 500 is extended to the maximum.

Figure 22:
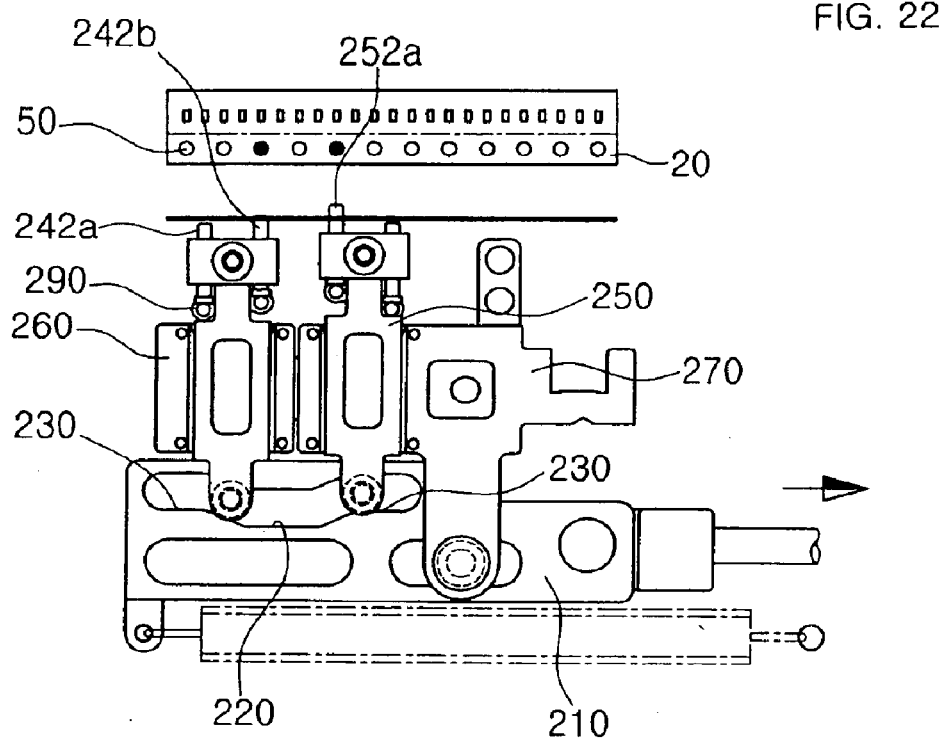

In such a state, as shown in FIG. 22, when the external power source, that is, the chip mounter or the air cylinder 510 is controlled to stop the supply of the compressed air, the cam slider 210 moves backward by the restoring force of the tension spring 561. Thus, the front locator 240 moves upward along the fixed rail 260 while passing a junction between the concave cam section 220 and the convex cam section 230. Meanwhile, the rear locator 250 horizontally slides along the convex cam section 230 to reach a junction between the concave cam section 220 and the convex cam section 230.

At this time, the lock pin 242a of the front locator 240 is not aligned with the feeding hole 50, so that an end of the lock pin 242a contacts the paper tape 20, and thereby the upward movement of the front locator 240 is prevented. In this case, the seesaw link 290 is rotated so that the lock pin 242b of the front locator 240 passes through the feeding hole 50 to lock the feeding hole 50. Meanwhile, the lock pin 252a of the rear locator 250 keeps passing through the feeding hole 50, as shown in FIG. 21.

Figure 23:
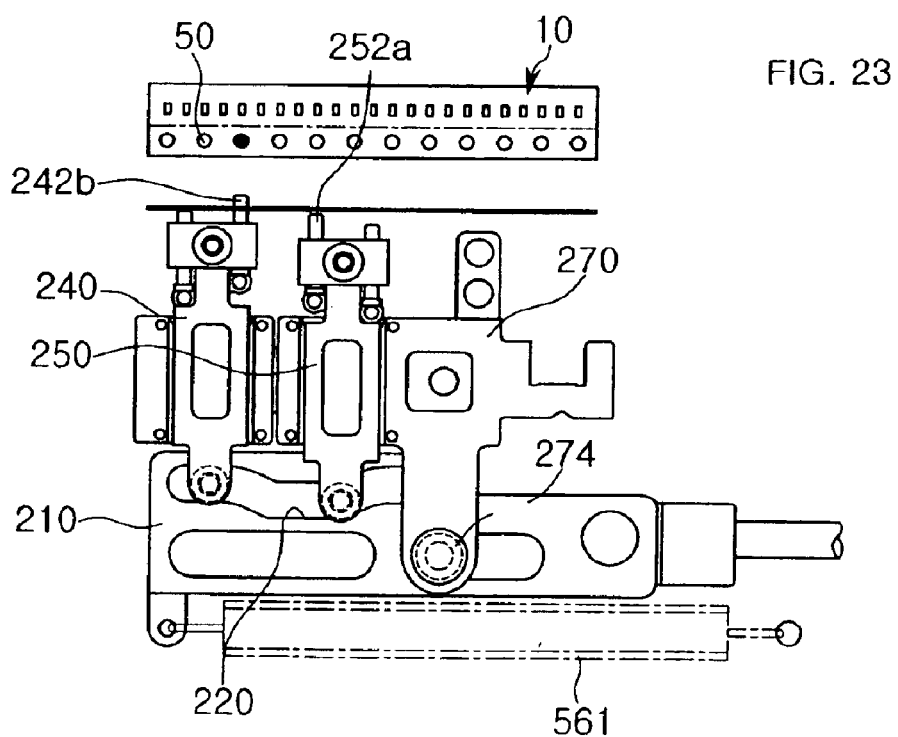

In such a state, when the cam slider 210 further moves backward by the tension spring 561, as shown in FIG. 23, the lock pin 242b of the front locator 240 passes through the feeding hole 50 of the carrier tape 10 to lock the feeding hole 50. Simultaneously, the rear locator 250 downward moves along the movable rail 270 while reaching the concave cam section 220. At this time, the lock pin 252a of the rear locator 250 is removed from the feeding hole 50 of the carrier tape 10.

When the cam slider 210 further moves backward in such a state, as shown in FIG. 24, the movable rail 270 moves backward along the horizontal rail section 262 of the fixed rail 260, together with the rear locator 250, by a half of a pitch Pa between the feeding holes 50 of the carrier tape 10, that is, 2 mm, while the support roll 274 of the vertical arm 273 being in contact with the feeding slot 212.

In such a state, as shown in FIG. 25, when the air cylinder 510 is controlled to move the cam slider 210 forward again, the front locator 240 slides from the convex cam section 230 to the junction between the convex cam section 230 and the concave cam section 220. Further, the rear locator 250 slides from the concave cam section 220 to the convex cam section 230 while keeping the feeding hole 50 of the carrier tape 10 locked.

At this time, the lock pin 252a of the rear locator 250 contacts the lower surface of the carrier tape 10, so that the seesaw link 291 is rotated so that the lock pin 252b moves upward and passes through the feeding hole 50 to lock the feeding hole 50.

Figure 26:
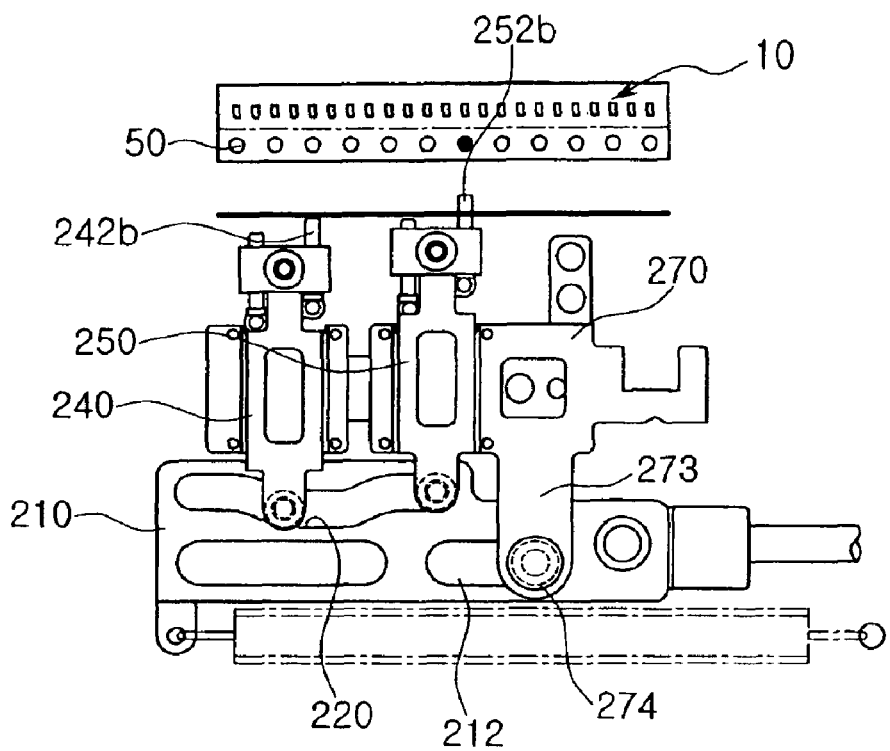

When the cam slider 210 further moves forward in such a state, as shown in FIG. 26, the front locator 240 moves downward to the concave cam section 220 and the lock pin 242b of the front locator 240 is removed from the feeding hole 50. Further, the lock pin 252b of the rear locator 250 keeps passing through the feeding hole 50 of the carrier tape 10 to lock the feeding hole 50, while the support roll 274 of the vertical arm 273 of the movable rail 270 contacts an inner edge of a rear portion of the feeding slot 212.

Figure 27:
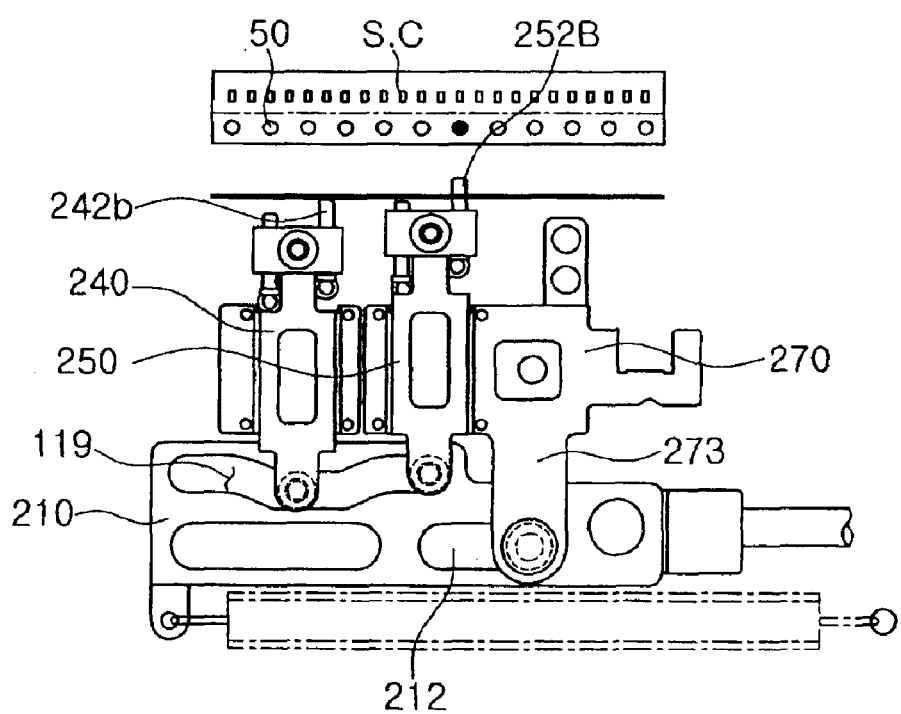

In such a state, when both the cam slider 210 and the movable rail 270 move forward by 2 mm as shown in FIG. 27, and then the cam slider 210 moves backward as shown in FIG. 28, the lock pin 242b of the front locator 240 contact the carrier tape 10. Thereby, the seesaw link 290 is rotated so that the lock pin 242a passes through the feeding hole 50 to lock the feeding hole 50.

In such a state, when the cam slider 210 further moves backward as shown in FIG. 29, the lock pin 242a of the front locator 240 passes through the feeding hole 50 to lock the feeding hole 50, while the rear locator 250 moves to the concave cam section 220 so that the lock pin 252b is removed from the feeding hole 50.

In such a state, the cam slider 210 further moves backward by 2 mm to return to the original state shown in FIG. 19. By repeatedly executing the above operations, the carrier tape 10 is fed by the pitch of 2 mm while the chips being fed to the chip mounter.

In the tape feeding unit 200 of this invention, the moving distance of the movable rail 270 is controlled by the pitch adjusting unit 600.

In a detailed description, the stopper 610 coupled to the locking arm 273a of the movable rail 270 is controlled by the adjusting bolt 660, so that an interval between the front and rear locators 240 and 250 is adjusted, thus offsetting a small deviation generated during a use of the tape feeder and preventing a feeding error.

Further, the movable rail 270 is fixed at a desired position without a shake by a magnetic force of the magnet 620 received in the protrusion of the stopper 610, until the cam slider 210 moves backward and the support roll 274 of the vertical arm 273 comes into contact with the inner surface of the front portion of the feeding slot 212, thus absorbing any impact and vibration acting on an end of the feeding slot 212.

In the present invention, the vinyl cover 40 taped on the carrier tape 10 is peeled off while the paper tape 20 is fed by a predetermined pitch by the tape feeding unit 200. Subsequently, the vinyl cover 40 is drawn upward through the picking hole 316 of the gate cover 310 of the gate unit 300 while being guided to the guide roller 318. Thereafter, the vinyl cover 40 is discharged by the vinyl cover discharging unit 400.

The gate cover 310 of the gate unit 300 is coupled by the shaft pin 121 to the coupling projection 275 which is upwardly projected from the movable rail 270. Thus, the vinyl cover 40 is forcibly drawn and discharged by the vinyl cover discharging unit 400 while the gate cover 310 moving in the same direction as the movable rail 270.

In a detailed description, since the gate cover 310 moves in a discharging direction of the vinyl cover 40 while the vinyl cover 40 being discharged, the carrier tape 10 moves to the picking hole 316 while tightly holding the chips, thus preventing the chips from being turned over or removed from the carrier tape 10, therefore preventing the malfunction of the chip mounter when the chips are picked.

While the carrier tape 10 passing through the gate unit 300, the carrier tape 10 is divided into the paper tape 20 and the vinyl cover 40. When the first discharging gear 410 of the vinyl cover discharging unit 400 is intermittently driven by the drive unit 500 to engage with the second discharging gear 420, the vinyl cover 40 is discharged by the rotation of the first and second discharging gears 410 and 420.

In a detailed description, when the drive unit 500 executes the forward operation, the slide link 550 coupled to the actuating rod 520 of the air cylinder 510 moves forward.

At this time, since the slide link 550 moves forward while pulling the support pin 442 contacting the rear end of the slot 551 of the slide link 550, the index link 440 executes an idle rotation. Meanwhile, when the slide link 550 moves backward by the drive unit 500, the index link 440 returns to an original position by a tensile force of the tension spring 451 supported to the predetermined portion of the body 100 by the hook piece 443. Therefore, the one-way clutch bearing 430 assembled with the center shaft 441 is operated to rotate the first discharging gear 410. As the first discharging gear 410 rotates, the first discharging gear 410 engages with the second discharging gear 420, thus feeding and discharging the vinyl cover 40 by the rotation of the first and second discharging gears 410 and 420.

In the tape feeder of the present invention, the front and rear locators 240 and 250 vertically move in the fixed rail 260 and the movable rail 270, respectively, while the movable rail 270 horizontally moves, by the reciprocating motion of the cam slider 210, so that the feeding holes 50 of the carrier tape 10 are locked while the carrier tape 10 being precisely fed by a predetermined pitch. Therefore, since the tape feeder of the present invention does not rotate, different from a conventional index-type rotation dividing system where a carrier tape is fed along a circle by the rotation of a sprocket wheel and a ratchet, any cumulative tolerance is not produced during the movement of the tape feeder of the present invention. Therefore, it is unnecessary to re-adjust the tape feeder of this invention while being in use, thus enhancing operational efficiency of the tape-feeder.

Further, the tape feeder of this invention is constructed so that the front and rear locators 240 and 250 move vertically by the cam slider 210, while being restrained by the restraint slot 119 which is provided on the cam slider 210 and has the concave cam section 220 and the convex cam sections 230 to form a closed loop, thus reducing the number of elements and prolonging the life-span of the tape feeder.

Furthermore, the rolling balls 280 enclosed in the ball cage 281 are provided on each of the guide grooves of the front locator 240, the guide grooves of the rear locator 250, and the guide grooves of the movable rail 270, thus minimizing noise and friction between the moving elements, therefore achieving a high-precision feeding operation.

As described above, the present invention provides a tape feeder for chip mounters which is constructed so that a carrier tape loaded with semiconductor chips is fed by a rectilinear feeding unit, thus achieving a high-precision feeding operation, and a locator moving vertically is in contact with a cam slider moving horizontally, thus reducing the number of elements, preventing a malfunction of the tape feeder, and prolonging the life-span of the tape feeder. Further, the tape feeder of this invention prevents the chips from being turned over or removed from the carrier tape while a vinyl cover is discharged, thus minimizing a malfunction when the chips are picked and thereby maximizing operational reliability of the tape feeder. Further, since the tape feeder of this invention has a slim construction, it is possible to remarkably increase the number of tape feeders mounted to a chip mounter, thus increasing production efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A tape feeder for chip mounters, comprising:
   a body mounted to a predetermined portion of a chip mounter;
   a tape feeding unit provided at a front portion of the body to feed a carrier tape by a predetermined pitch, the tape feeding unit comprising:
   a cam slider reciprocating horizontally and including a restraint slot, the restraint slot having a concave cam section and convex cam sections provided on both sides of the concave cam section;
   front and rear locators to move up and down while coming into alternate contact with the concave cam section and the convex cam sections by the reciprocating motion of the cam slider, each of the front and rear locators comprising:
   a pin holder provided at an upper portion of each of the front and rear locators to guide vertical movements of a plurality of lock pins; and
   a seesaw link provided on each of the front and rear locators to move up and down, and having a base pin to support a bottom of each of the plurality of lock pins;
   a fixed rail mounted to a predetermined portion of the body to guide a vertical movement of the front locator;
   a movable rail coupled to the cam slider to guide a vertical movement of the rear locator, the movable rail horizontally moving in a horizontal rail section of the fixed rail by a feeding pitch of the carrier tape;
   a gate unit to mount the carrier tape and guide the carrier tape when the carrier tape is fed;
   a vinyl cover discharging unit including first and second discharging gears engaging with each other, with a vinyl cover peeled off the carrier tape being discharged by a predetermined pitch by a rotation of the first and second discharging gears;
   a drive unit to simultaneously drive an actuating rod of an air cylinder coupled to the tape feeding unit and at least one of the first and second discharging gears of the vinyl cover discharging unit; and
   a pitch adjusting unit mounted to a predetermined portion of the body to limit a backward movement of the movable rail of the tape feeding unit.

2. The tape feeder according to claim 1, wherein the cam slider comprises:
   a guide slot and a feeding slot provided on predetermined portions of the cam slider under the restraint slot, the guide slot and the feeding slot being coupled to a support pin assembled with the body and the movable rail, respectively, to guide the reciprocating motion of the cam slider;

a bracket projected to a bottom of a front portion of the cam slider and biased backward by a tension spring, the tension spring being coupled at a first end thereof to the bracket and coupled at a second end thereof to the body; and a pin insert hole provided on a rear portion of the cam slider and coupled to the actuating rod of the air cylinder by a coupling pin.

3. The tape feeder according to claim 1, wherein each of the front and rear locators comprises:

a roller bearing provided on a lower portion of each of the front and rear locators to slide along the restraint slot of the cam slider while being restrained by the restraint slot, the roller bearing sliding along the concave cam section and the convex cam sections by the reciprocating motion of the cam slider to move each of the front and rear locators up and down.

4. The tape feeder according to claim 1, wherein each of the pin holders is made of a ceramic material.

5. The tape feeder according to claim 1, further comprising:

a plurality of rolling balls enclosed in a ball cage made of a resin material, the plurality of rolling balls being provided on each of guide grooves of the front locator movably installed in a vertical rail section of the fixed rail, guide grooves of the rear locator movably installed in a vertical rail section of the movable rail, and guide grooves of the movable rail movably installed in the horizontal rail section of the fixed rail.

6. The tape feeder according to claim 2, wherein the movable rail comprises a vertical arm downwardly projected from a predetermined portion of the movable rail, the vertical arm of the movable rail being coupled to the feeding slot of the cam slider by a support roll so that the vertical arm slides along the feeding slot of the cam slider.

7. The tape feeder according to claim 1 or 2, wherein the movable rail comprises a locking arm projected from a predetermined portion of the movable rail, with a horizontal movement of the movable rail being limited by the pitch adjusting unit which is coupled to the locking arm.

8. The tape feeder according to claim 7, wherein the pitch adjusting unit comprises:

a stopper mounted to a predetermined portion of the body to move horizontally, the stopper including a protrusion to receive a magnet seated in the locking arm of the movable rail;

a screw holder fastened to a predetermined portion of the body using a fastening unit;

an adjusting bolt screwed to a screw hole of the screw holder, with a head of the adjusting bolt being fitted into a fitting recess provided in a rear portion of the stopper; and a locking nut to lock the adjusting bolt.

9. The tape feeder according to claim 8, wherein the stopper is movable forward and backward so that a distance between the locking arm of the movable rail and the magnet is equal to a pitch of a plurality of feeding holes of the carrier tape.

10. The tape feeder according to claim 7, wherein the locking arm comprises a stop notch provided on a bottom of the locking arm, the stop notch being biased by a ball plunger of a slip preventing unit fastened to a predetermined portion of the body.

11. The tape feeder according to claim 1, wherein the gate unit comprises:

a gate cover mounted to an upper end of the body by inserting a shaft pin into a guide hole bored through the upper end of the body, the gate cover rotating about the shaft pin and moving forward and backward;

a locking guide having a longitudinal slot and mounted to a predetermined portion of the body by a support pin passing through the slot, thus moving along the body, the locking guide keeping the gate cover closed; and a guide support unit to support the locking guide, with a ball plunger having a compression spring and a ball and being placed in the guide support unit so as to lock the locking guide in a vertical direction.

12. The tape feeder according to claim 1 or 11, wherein the gate cover of the gate unit is coupled to the movable rail by inserting the shaft pin into both the guide hole of the body and a hole of a coupling projection upwardly projected from the movable rail, so that the gate cover moves forward or backward by a moving distance of the movable rail.

13. The tape feeder according to claim 1 or 11, wherein the gate cover comprises:

a large locking hole through which the lock pins of the front locator pass;

a plurality of small locking holes through which the lock pins of the rear locator pass;

a plurality of mount holes provided on both sides of the gate cover at diagonally opposite positions;

a picking hole formed along a part of the gate cover to be placed near to the large locking hole; and a plurality of support arms provided on both sides of a rear portion of the gate cover to be upwardly inclined at a predetermined angle, with a guide roller being provided between the support arms to guide a discharge of the vinyl cover of the carrier tape.

14. The tape feeder according to claim 13, wherein the gate cover further comprises a dust cover to cover the large locking hole and the small locking holes.

15. The tape feeder according to claim 14, wherein the dust cover is made of a transparent resin material, such as an acrylic resin, the dust cover comprising:

a plurality of mount projections downwardly projected from the dust cover to correspond to the mount holes of the gate cover, thus being detachably mounted to the gate cover; and a plurality of depressions to correspond to the large locking hole and the small locking holes.

16. The tape feeder according to claim 1, wherein the vinyl cover discharging unit comprises:

an index link coupled at a center shaft thereof to a pinion hinge which is screwed to the body;

a first discharging gear coupled to a one-way clutch bearing which is assembled with the center shaft of the index link;

a tension spring supported at a first end thereof to a support pin of the index link, and supported at a second end thereof to a hook piece which is screwed to the body, with the support pin passes through a slot of a slide link of the drive unit to transmit power from the air cylinder;

a rotary bracket mounted to the body using a shaft pin, the rotary bracket being connected to a first end of another tension spring which is connected at a second end thereof to a hook pin mounted to a predetermined portion of the body, so that the rotary bracket is upwardly biased; and a guide roller mounted to a predetermined portion of the body to guide the vinyl cover between the first and second discharging gears, with the second discharging gear coupled to an end of the rotary bracket to engage with the first discharging gear.

17. The tape feeder according to any one of claims 1, 2 and 16, wherein the drive unit comprises:

a double-acting air cylinder mounted to a predetermined portion of the body;

a front joint coupled to a front end of the actuating rod of the double-acting air cylinder to be coupled to the pin insert hole of the cam slider;

a rear joint coupled to a rear end of the actuating rod of the air cylinder to transmit power of the air cylinder to an index link of the vinyl cover discharging unit; and a tension spring connected at a first end thereof to a bracket of the vinyl cover discharging unit, and connected at a second end thereof to a support pin which is mounted to a predetermined portion of the body to bias the actuating rod of the air cylinder backward.

18. The tape feeder according to claim 17, wherein the double-acting air cylinder comprises a slim construction having an elliptical sectional area to be housed within a width of the body.

19. The tape feeder according to claim 16, wherein the drive unit further comprises a manual handle, the manual handle being connected at an end thereof to a link pin provided at a rear end of the slide link, and rotating about a shaft pin which is mounted to a predetermined portion of the body, thus moving the slide link forward and backward.

20. The tape feeder according to claim 1, further comprising:

a cover plate screwed to the front portion of the body so as to cover the front portion of the body, thus protecting the tape feeding unit.

21. The tape feeder according to claim 1, further comprising:

a toggle joint-type clamping unit comprising a linkage having four links, the clamping unit provided at a predetermined portion of the body to be mounted to a feeder base of the chip mounter.

22. The tape feeder according to claim 21, wherein the clamping unit comprises:

a clamp lever mounted at an intermediate portion thereof to the body by a first shaft pin to rotate about the shaft pin;

a connecting link connected at a first end thereof to the clamp lever by a second shaft pin to be horizontally placed along the body;

an interlocking link connected at a first end thereof to a second end of the connecting link by a third shaft pin;

a support link connected at a first end thereof to an intermediate portion of the interlocking link by a fourth shaft pin, and connected at a second end thereof to a predetermined portion of the body by a fifth shaft pin; and a clamping link connected at an intermediate portion thereof to a second end of the interlocking link by a sixth shaft pin, and connected at a first end of the clamping link to a predetermined portion of the body by a seventh shaft pin, with a roller bearing being mounted to a second end of the clamping link.

* * * * *